(12) United States Patent
Hebert

(10) Patent No.: US 6,888,207 B1
(45) Date of Patent: May 3, 2005

(54) HIGH VOLTAGE TRANSISTORS WITH GRADED EXTENSION

(75) Inventor: Francois Hebert, San Mateo, CA (US)

(73) Assignee: Linear Technology Corporation, Milpitas, CA (US)

(*) Notice: Subject to any disclaimer, the term of this patent is extended or adjusted under 35 U.S.C. 154(b) by 0 days.

(21) Appl. No.: 10/683,922

(22) Filed: Oct. 10, 2003

Related U.S. Application Data

(62) Division of application No. 10/087,881, filed on Feb. 28, 2002, now Pat. No. 6,677,210.

(51) Int. Cl.$^7$ .............................................. H01L 29/72
(52) U.S. Cl. ...................... 257/409; 257/410; 257/412; 257/414; 257/655; 257/666; 257/668; 257/669
(58) Field of Search ................................. 257/409, 410, 257/412, 414, 655, 666, 668, 669

(56) References Cited

U.S. PATENT DOCUMENTS

| | | | |
|---|---|---|---|
| 4,290,078 A | * | 9/1981 | Ronen .......................... 257/409 |
| 5,132,753 A | * | 7/1992 | Chang et al. ................ 257/655 |
| 5,328,859 A | | 7/1994 | Vo et al. |
| 5,346,835 A | | 9/1994 | Malhi et al. |
| 5,424,226 A | | 6/1995 | Vo et al. |
| 5,438,220 A | | 8/1995 | Nakagawa et al. |
| 5,646,054 A | | 7/1997 | Rhee |

FOREIGN PATENT DOCUMENTS

| | | |
|---|---|---|
| JP | 04-208571 | 7/1992 |

OTHER PUBLICATIONS

Contiero et al. "Characteristics and Applications of a 0.6.mu.m Bipolar–CMOS–DMOS Technology combining VLSI Non–Volatile Memories," IEEE, 1998.

El–Diwany et al. "1.5.mu.m Analog BiCMOS/DMOS Process for Medium Voltage and Current Power ICs Applications up to 50V," Proceedings of the 1995 Bipolar/BiCMOS Circuits and Technology Meeting.

Thomas et al, "High–Voltage Technology Offers New Solutions for Interface Integrated Circuits," IEEE Transactions on Electron Devices, vol. ED–33, No. 12, Dec. 1986.

Tsai et al. "16–60V Rated LDMOS Show Advanced Performance in an 0.72.mu.m Evolution BiCMOS Power Technology," IEEE, 1997.

* cited by examiner

Primary Examiner—Edward Wojciechowicz
(74) Attorney, Agent, or Firm—Townsend and Townsend and Crew LLP; Steven J. Cahill

(57) ABSTRACT

High voltage transistors with high breakdown voltages are provided. These high voltage transistors are formed with graded drain extension regions. The concentration of charge carriers increases farther away from the gate across each drain extension region, causing severe electric fields to be moved away from the gate. Methods and structures of the present invention may be used to increase a transistor's breakdown voltage to the theoretical limit of the device. High voltage transistors with graded extension regions may be p-channel or n-channel MOSFETs.

29 Claims, 16 Drawing Sheets

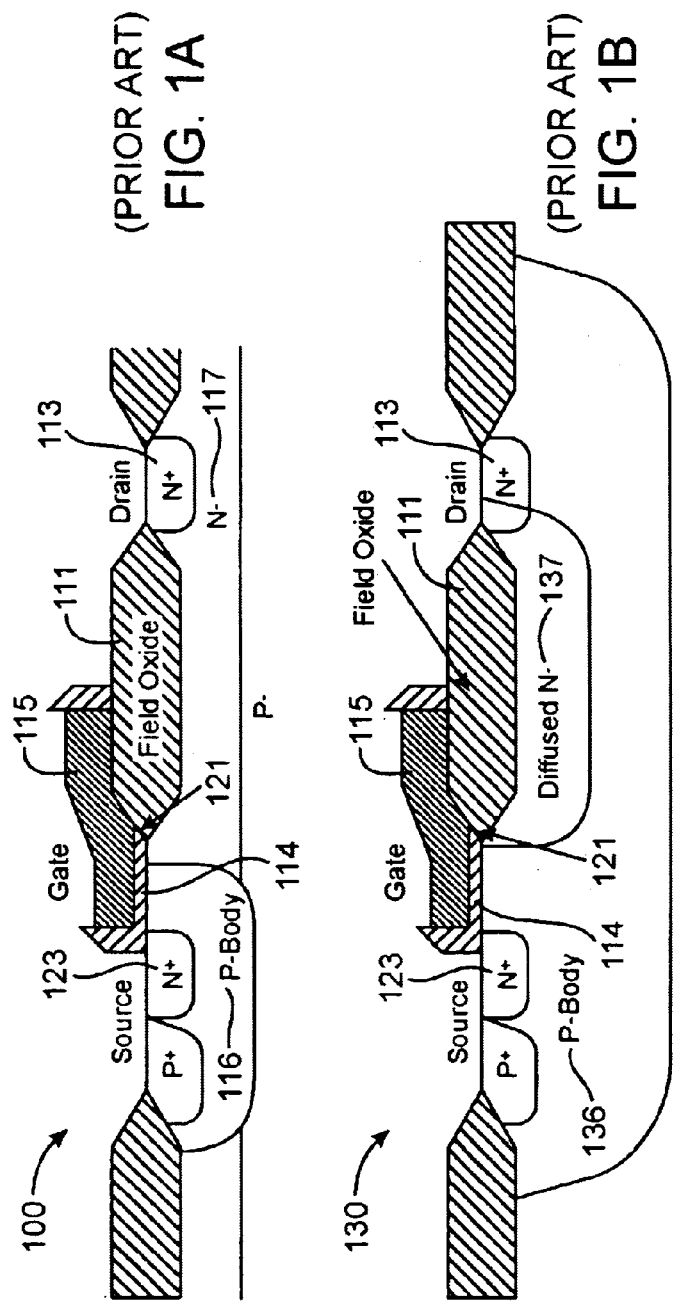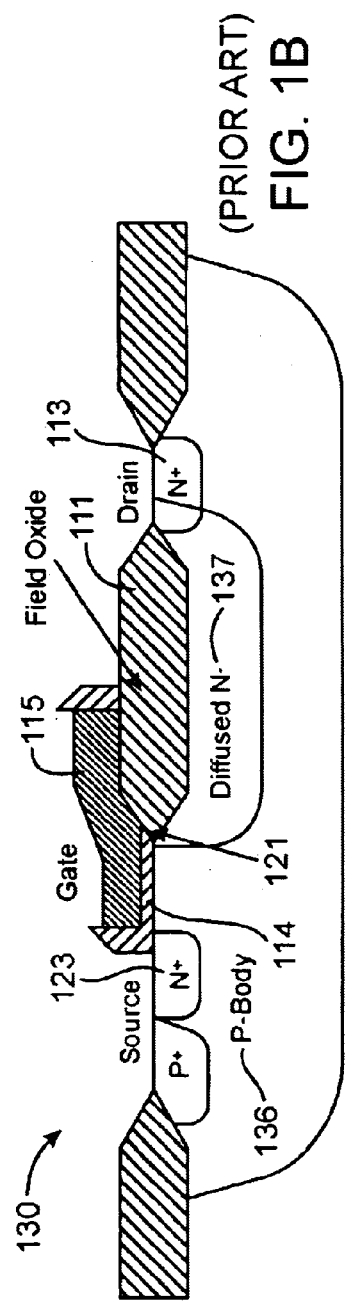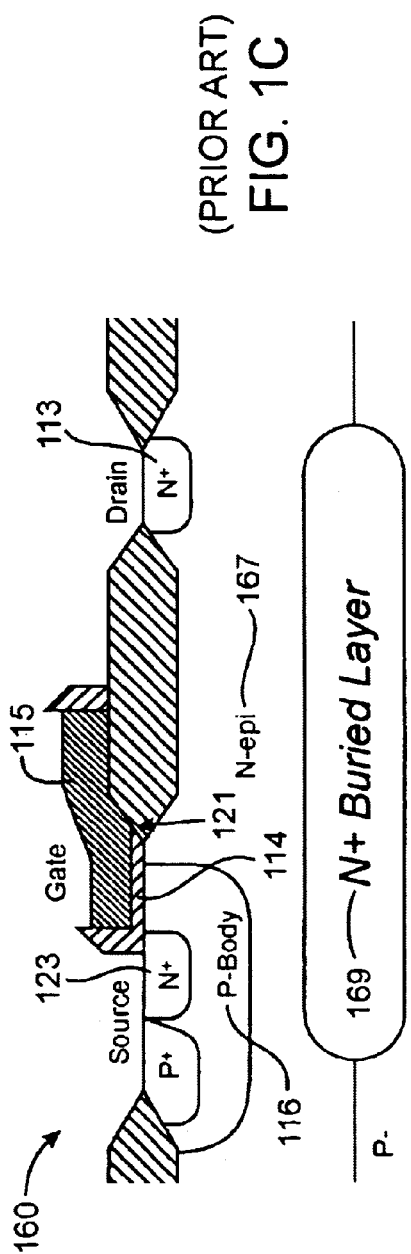

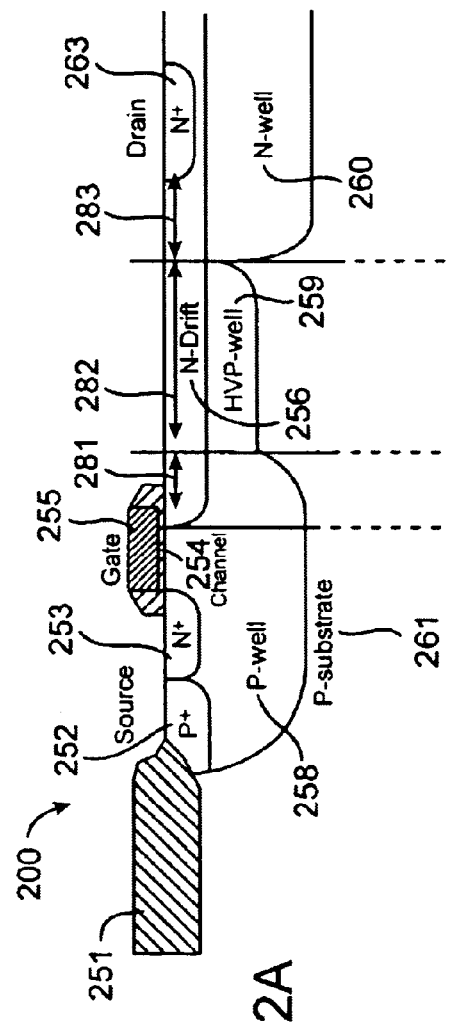
FIG. 2A
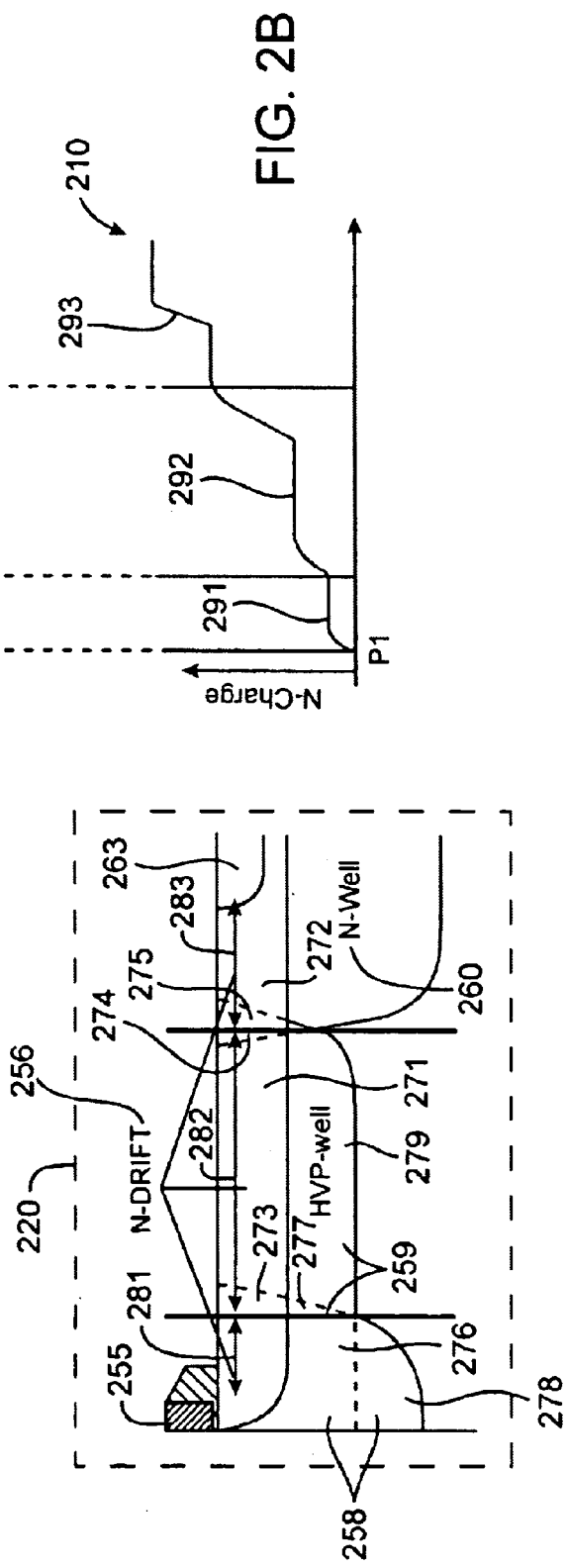
FIG. 2B
FIG. 2C

US 6,888,207 B1

HIGH VOLTAGE TRANSISTORS WITH GRADED EXTENSION

CROSS-REFERENCE TO RELATED APPLICATIONS

This application is a divisional of U.S. patent application 10/087,881, filed on Feb. 28, 2002, now U.S. Pat. No. 6,677,210 which is incorporated herein by reference.

BACKGROUND OF THE INVENTION

This invention relates to systems and methods for creating high voltage Metal Oxide Semiconductor Field Effect Transistors (MOSFETs). More specifically, this invention relates to systems and methods of creating high voltage MOSFETs with graded extensions that provide a high breakdown voltage.

High voltages applied to the terminals of a MOSFET can cause breakdown in the transistor as a result of the high electric fields generated. FIG. 1A illustrates a cross section of a first prior art high voltage lateral DMOS transistor 100. Transistor 100 includes source 123, body 116, drain 113, and n-epitaxial layer 117. A disadvantage of transistor 100 is that it typically has a high threshold voltage (e.g., 1.5–5 volts) that is not compatible with low voltage (LV) CMOS technology.

FIG. 1B illustrates a cross section of a second prior art high voltage lateral DMOS transistor 130. Transistor 130 includes source 123, body 136, drain 113, and diffused n-type drain extension region 137. FIG. 1C illustrates a cross section of a third prior art high voltage lateral DMOS transistor 160. Transistor 160 includes source 123, body 116, drain 113, n-epitaxial layer 167, and N+ buried layer 169.

Transistors 100, 130 and 160 each include thick field oxide 111 and thin oxide 114. Thick field oxide 111 reduces the electric field on the drain side of gate 115. Thick field oxide 111 in transistors 100, 130, and 160 includes bird's beak encroachment 121. A disadvantage of transistors 100, 130, and 160 is that bird's beak 121 increases the ON-resistance $R_{DS(ON)}$ of transistor 100.

Transistors 100, 130, and 160 have a large overlap of the gate polysilicon over the drain extension region that results in an increase in the gate-to-drain capacitance. This overlap is a further disadvantage of the prior art, because it reduces the frequency response of the transistor.

For lateral DMOS 160 to have a drain source breakdown voltage $BV_{dss}$ greater than 100 volts, N-epitaxial layer 167 must be greater than 10 microns, which is not compatible with low voltage (LV) CMOS or LV BiCMOS processes. DMOS 160 also has a high output capacitance, because all of N-epitaxial layer 167 is coupled to the output of the transistor, which negatively affects the propagation delay and switching characteristics of the device.

Lateral DMOS transistors 100, 130, and 160 limit potential high breakdown voltages, because they use drain extensions with non optimized doping gradients. When doping is substantially constant throughout a transistor's drain between the gate and the N+ drain contact, the charge concentration of majority carriers is not optimized. Electric fields present in the drain region next to the gate are the same as the electric fields present in drain region next to the N+ drain contact region, increasing the possibility of breakdown at very high electric fields.

BRIEF SUMMARY OF THE INVENTION

High voltage transistors of the present invention have a gradient of majority charge carriers in the drain that increases laterally farther away from the gate. By varying the lateral charge concentration in the drain, potentially severe electric fields may be controlled and manipulated.

To increase the drain breakdown voltage of a transistor, severe electric fields in the drain can be moved farther from the transistor's channel and gate regions. This may be accomplished by providing graded drain extensions with a charge carrier profile that increases laterally away from the channel region. The breakdown voltage in a transistor of the present invention may approach the theoretical limit of the device. The graded drain extensions reduce the electric fields near the transistor's channel region and other hot, electron-sensitive, areas.

A laterally increasing charge carrier profile in the drain may, for example, be formed by diffusing one or more drain dopants into multiple overlapping wells. The charge carriers in the overlapping wells compensate the drain dopant to produce the laterally increasing charge carrier profile.

High voltage transistors of the present invention may have a variety of geometric configurations. For example, transistors of the present invention may include overlapping regions that form a triple drain extension. High voltage transistors of the present invention may be, for example, MOS field effect transistors including P-channel and N-channel MOSFETs.

As another example, the present invention includes transistors with a ring-gate structure that eliminates the risk of premature edge (termination) breakdown and increases device performance and reliability. Transistors of the present invention may also have a striped-gate structure that can be realized with a single metal layer. Minimizing the number of metal layers can reduce production costs, increase wafer device density, and reduce routing problems.

Fabrication of high voltage transistors of the present invention may result in low output capacitance, a lower gate-to-drain capacitance, a low threshold voltage of (e.g., 0.7 V), and a low drain-source ON resistance $R_{DS(ON)}$. A low drain-source ON resistance can reduce the voltage drop across a transistor's channel, thus increasing performance and reliability. Furthermore, a transistors of the present invention may be compatible with both low voltage CMOS and low voltage BiCMOS fabrication processes.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which:

FIG. 1A–1C are a cross sectional views of three prior art lateral DMOS transistors;

FIG. 2A is a cross sectional view of an very high voltage NMOS (VHVNMOS) transistor with a triple drain extension fabricated in accordance with the principles of the present invention;

FIG. 2B is a graphical illustration of N– charge versus lateral distance in the drain of the transistor of FIG. 2A;

FIG. 2C is an exploded view of a portion of the VHVNMOS transistor of FIG. 2A;

DETAILED DESCRIPTION OF THE INVENTION

Figure 3:
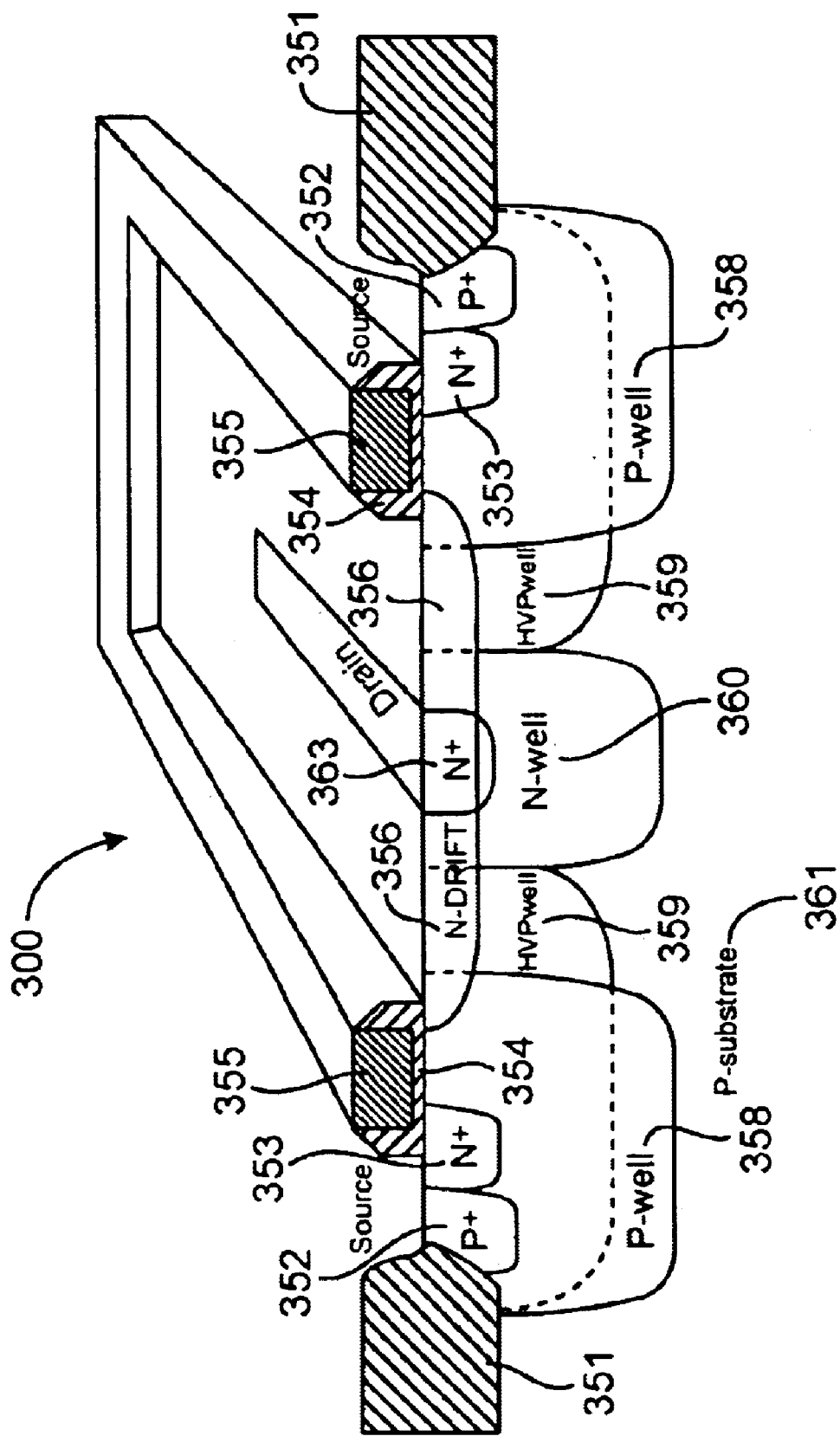
FIG. 3 is a partial sectional view, partial three-dimensional illustration of an VHVNMOS transistor having a ring-gate geometry constructed in accordance with the principles of the present invention.

FIG. 2A shows a very high voltage NMOS (VHVNMOS) transistor 200 having a drain extension with a lateral charge gradient, in accordance with the principles of the present invention. In a first embodiment of the present invention, the lateral charge gradient can be implemented using three adjacent drain extension regions. This embodiment is called an MOS transistor with a triple drain extension.

Transistor 200 has a triple drain extension that includes three diffused N-extension drain regions. N-type charge carriers are graded across the three N-extension drain regions. N type charge increases from the gate to the drain contact region across each extension region. By grading the N-charge in the three drain extension regions, the electric fields between the transistor's gate and drain are successfully spread out farther from the channel.

As a result, high voltage transistors of the present invention have drain-to-substrate breakdown voltages that approach the theoretical limit of the devices. The drain-substrate breakdown voltage is a function of the substrate doping. For example, the drain-substrate breakdown may be 200 volts for a device with a resistivity of 12 ohms-cm. A higher substrate resistivity may be used to achieve a higher breakdown voltage.

Transistor 200 is fabricated to include field oxide 251, body contact P+ region 252, N+ source region 253, P-well 258, gate oxide 254, gate 255, N-drift region 256, high voltage (HV) P-well 259, N-well 260, and N+ drain region 263. These regions are formed on P-substrate 261. N-drift implant 256 is used to self-align the channel. In conjunction with the P-regions diffused underneath, N-drift implant 256 forms the triple drain extension. Specifically, N-drift 256 may be formed to include first extension region 281, second extension region 282, and third extension region 283, as shown by arrows in FIG. 2A.

First extension region 281 is formed as a result of the overlap between P-well 258 and N-drift region 256. N-drift 256 is compensated by P type well 258 in the overlapping region. The compensation reduces N-type charge carriers in region 281 under gate 255. Curve 291 of FIG. 2B illustrates the reduces N-charge in region 281.

Second extension region 282 is formed as a result of the overlap between N-drift region 256 and high voltage (HV) P type well 259. HV P-well 259 is formed with a lower p-type doping concentration that P-well 258. For this reason, the second extension region 282 of N-drift 256 is not compensated as much as the first extension region 281. Therefore, second extension region 282 of N-drift 256 has a higher net concentration of N type charge carriers than first extension region 281. Curve 292 of FIG. 2B illustrates the increased N type charge carriers in extension region 282.

Third extension region 283 is formed as a result of the overlap between N-drift 256 and N-well 260. Third extension region 283 has a higher net N type doping concentration than first extension region 281 and second extension region 282, because the N type doping concentration in N-drift 256 is added to the N type doping of N-well 260. As a result, the concentration of N type charge carriers in third extension region 283 is higher than the concentration of N type charge carriers extension regions 281 and 282.

The drain region of transistor 200 includes N+ drain region 263 and drain extension regions 281, 282, and 283. The total lateral length of the drain extension regions may be, for example, 5–15 microns. A specific example of the drain extension length is 10 microns.

The net N type charge carrier/concentration in the triple drain extension of transistor 200 increases across extension regions 281–283 from the channel (under gate 255) to N+ drain contact 263. FIG. 2B illustrates the stepped increase in N-type charge carriers from gate 255 to N+ drain region 263. The N-type charge gradient across regions 281–283 causes the electric field to increase more gradually from gate 255 to N+ drain region 263. Changes in the concentration of N-charge in the drain extension occur in a step-wise fashion, increasing at each adjacent extension region junction, from the gate to N+ drain region 263.

Graph 210 of FIG. 2B shows N-charge versus lateral distance of the drain region. First curve 291 correlates to first extension region 281, and shows the effect of N-drift 256 diffusion in P-well 258. Second curve 292 correlates to second extension 282, and shows the effect of N-drift 256 diffusion in HV P-well 259. Third curve 293 correlates to third extension 283, and shows the effect of N-drift 256 diffusion of N-well 260. The region above N-well 260 and comprising highly doped N+ drain contact 263 is not considered to be part of the drain extension because the transistor's depletion layer stops at N+ drain contact region 263.

As shown in FIG. 2B, N– charge is zero in the channel region under gate 255 a point P1. This is illustrated in graph 210 where the N charge is zero. N– charge (curve 291) begins to rise in at the junction of the channel and first extension region 281. Changes in N– charge in first curve 291 may be associated with the depth and doping of N– drift 256 contained in first extension region 281 and any subsequent changes in the diffusion characteristics of first extension region 281. N– charge, as illustrated in first curve 291, continues to increase until the level of diffusion of N– drift 256 into P– well 258 stabilizes. The attributes of first extension regions 281 may be chosen to minimize doping in first extension region 281 so that a low concentration of N– charge may be obtained closest to gate 255.

The next increase in N– charge occurs in second extension region 282 as illustrated in second curve 292 of FIG. 2B. In second curve 292, N– charge increases in part because of the diffusion of N-drift 256 into HV P-well 259. The N charge concentration in second extension region 282 is greater than the N charge concentration in first extension region 281. N– charge levels in second extension region 282 may be effected by lateral interactions between first extension region 281 and second extension region 282.

N– charge in second curve 292 stabilizes, as illustrated in FIG. 2B, in conjunction with the stabilization of the diffusion attributes of second extension 282. As second extension region 282 approaches third extension region 283, curve 292 increases. Specifically, N-charge may be affected by diffusion interactions between second extension region 282, third extension region 283, HV P-well 259, and N-well 260. These diffusion interactions may cause the doping level of N-drift 256 to rise near the junction of second extension region 282 and third extension region 283. As a result, N– charge increases as illustrated in second curve 292.

As shown in graph 210, the level of N– charge stabilizes in the middle of third extension region 283. Third curve 293 illustrates the stabilization in charge that occurs when diffusion interactions between second extension region 282 and third extension region 283 stabilize. The final increase in the N– charge, also depicted in third curve 293, occurs with at the junction of N+ drain region 263. N– charge is at its maximum level in the drain region of transistor 200 at N+ drain 263, which is a relatively long distance from gate 255.

The magnitude of electrical N– charge has a positive effect on electrical field magnitude. The present invention grades the electrical field so that the maximum electric field value occurs at the region of maximum N– charge. For VHVNMOS transistor 200, the maximum electric field occurs at in the third extension region 283 at the N+ drain contact 263 junction. Because third extension 283 is placed far from gate 255, the maximum electric field contained in third extension 283 interacts minimally with gate 255. As a result, short channel effects caused by the field of the drain interfering with the field of the gate are decreased and higher breakdown voltages are realized. Additionally, unction periphery forms a large radius of curvature due to the depth of N-well 260 which leads to even a higher breakdown voltage. Transistor 200 also has a low output capacitance and a low drain source ON resistance.

The diffusion characteristics of transistor 200 and extension regions 281, 282, and 283 are illustrated in more detail in exploded view 220 of FIG. 2C. FIG. 2C is a magnified view of the triple drain extension in transistor 200 of FIG. 2A.

Persons skilled in the art will appreciate that P– well 258 may include two differently doped well regions LV (low voltage) P-well region 278 and P-well region 276. LV P-well region 278 correlates to the region of P-well region 258 that does not overlap HV P-well 259. P-well region 276 correlates to the region of P-well region 258 that overlaps HV P-well 259.

Persons skilled in the art will also appreciate that N-drift 256 in first extension region 281 may also diffuse into HV P-well 259 as shown in FIG. 2C. Therefore, when determining the doping levels to manipulate N– charge in first extension 281, one may consider how the p-type doping levels of both P-well 258 and HV P-well 259 effect the N– charge carriers in first extension 281.

The diffusion characteristics of N-drift 256 in second extension region 282 is illustrated in more detail in FIG. 2C. HV P-well 259 may include HV P-well regions 277 and 279. HV P-well 277 includes the portion of P-well 258 that overlaps HV P-well 259. HV P-well 279 includes the portion of HV P-well 259 that does not overlap P-well 258.

Additionally, N-drift 256 may include N-drift regions 271, 273, and 274. N-drift region 271 includes the portion of N-drift 256 that overlaps HV P-well 259 in second extension region 282. N-drift region 273 includes the portion of N-drift 256 that overlaps HV P-well 259 and P-well 258 in second extension region 282. N-drift region 274 includes the portion of N-drift 256 that overlaps N-well 260 and HV P-well 259 in second extension region 282. The presence of regions 271, 273, and 274 change the diffusion characteristics in N-drift 256.

The diffusion characteristics of third extension region 283 are illustrated in more detail in exploded view 220 of FIG. 2C. Persons of ordinary skill will appreciate that N-drift 256 in third extension region 283 may actually form N-drift region 272 and 275. N-drift 275 includes the portion of N-drift 256 that overlaps HV P-well 259 and N-well 260 in third extension region 283. N-drift 272 includes the portion of N-drift that only overlaps N-well 260 in third extension region 283.

Additional advantages may also be obtained through different geometries of a VHVNMOS transistor in accordance with the principles of the present invention. These advantages may affect transistor performance and capabilities such as breakdown voltage and drain source ON-resistance $R_{DS(ON)}$. Examples of such transistors include ring-gate and striped-gate geometries.

FIG. 3 is a ring-gate geometry 300 embodying principles of the present invention. Ring-gate geometry 300 may include many of the elements included in transistor 200 of FIG. 2A and discussed above. So that these elements are not repeatedly discussed, elements that are numbered "3XX" in FIG. 3 correspond to elements numbered "2XX" of FIG. 2A if they are labeled with the same "XX".

Ring-gate geometry 300 forms a ring with gate polysilicon 355 and gate oxide 354 to create a ring-gate electrode which surrounds N+ drain region 363, N-drift 356, N-well 360, and HV P-well 359. Ring-gate geometry 300 eliminates any risk of premature drain edge breakdown, also known as termination breakdown, from drain region 363 to the isolation region created by gate electrode ring 355. By eliminating risk of premature drain edge breakdown in a transistor, the transistor's reliability and performance increases. Gate electrode ring 355 may have corners that are circular, semicircular, elliptical, 45° corners, 90° corners, variable degree curves, or the any combination thereof.

Figure 4:
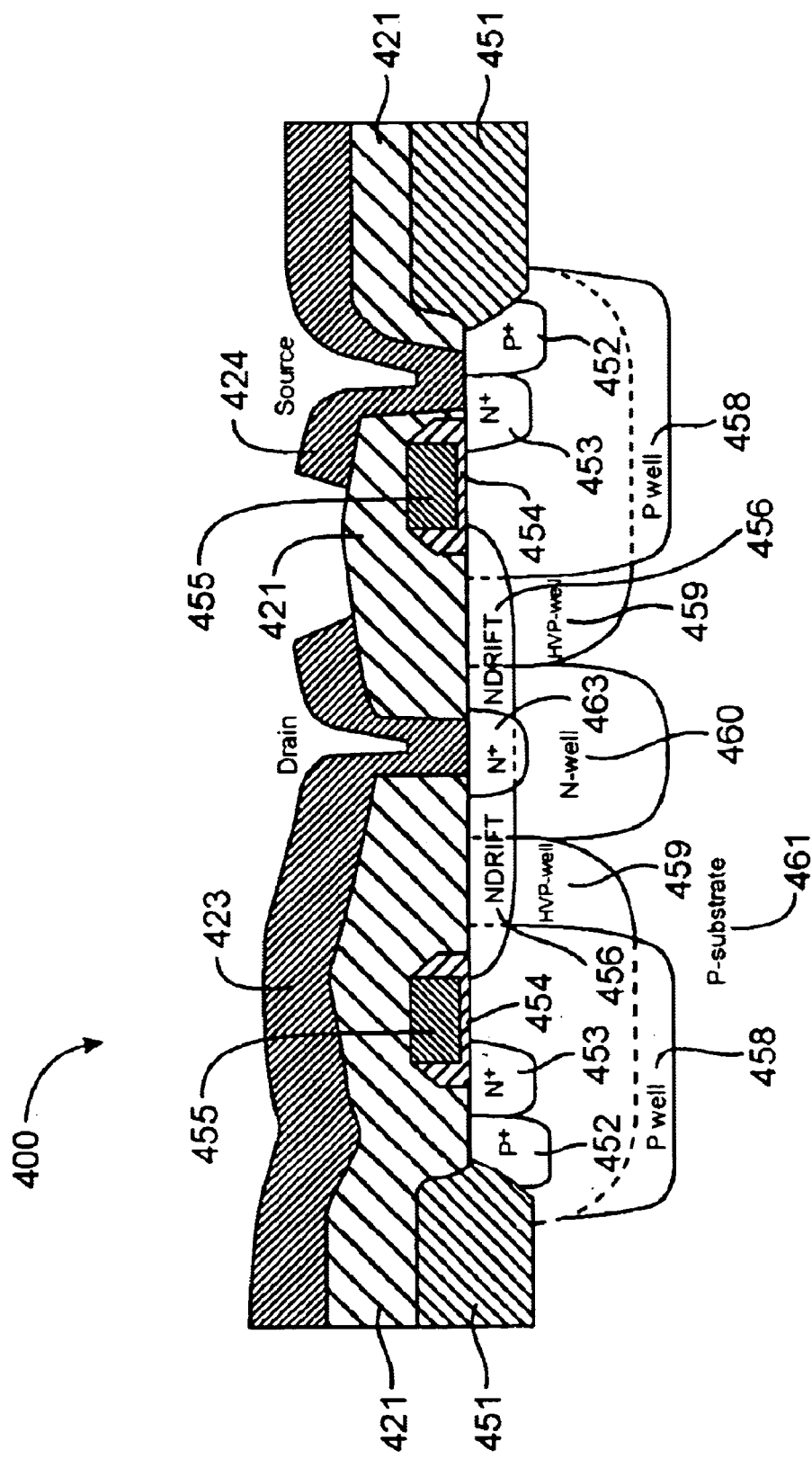
FIG. 4 is a cross sectional view of an VHVNMOS transistor having a ring-gate geometry fabricated with a single metal layer constructed in accordance with the principles of the present invention.

Ring-gate geometry 300 may be fabricated such that only a single metal layer is needed and is shown in ring-gate geometry 400 of FIG. 4. Ring-gate geometry 400 may include many of the elements included in ring-gate geometry 300 of FIG. 3 and discussed above. So that these elements are not repeatedly discussed, elements that are numbered "4XX" in FIG. 4 correspond to elements numbered "3XX" of FIG. 3 if they are labeled with the same "XX".

Ring-gate geometry 400 is accomplished by forming separate source and drain contacts with two different metal segments 423 and 424 of the same metal layer. Specifically, first metal segment 423 is connected to N+ drain contact 463, while first metal segment 424 is connected to N+ source contact 453. Additionally, a dielectric layer 421 may be placed between first metal segments 423 and 423.

In a single metal ring-gate configuration, a drain-source ON-resistance $R_{DS(ON)}$ shift may occur, after long-term stressing at high drain to source voltages and drain currents, because first metal segment 423 forms a drain electrode which crosses directly over the drain extension and gate structure. Therefore, the electric field under drain electrode 423 becomes very high as $V_{DS}$ increases. This results in localized stressing of the gate structure and surrounding dielectric films. One possible solution is to fabricate a gate shield to isolate gate 455 from the drain metal layer 423. The implementation of a gate shield, however, requires an additional conductive layer. This conductive layer may be, for example, doped polysilicon or metal.

Figure 5A:
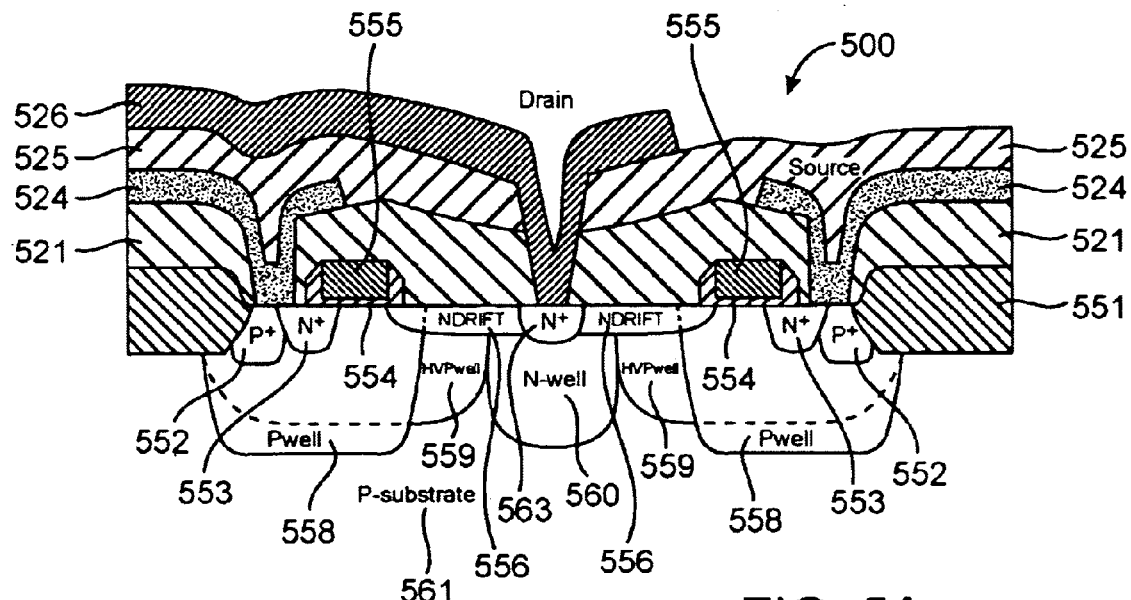
FIG. 5A is a cross sectional view of an VHVNMOS transistor having a ring-gate geometry fabricated with two metal layers constructed in accordance with the principles of the present invention.

A ring-gate geometry 500 with two metal layers is illustrated in FIG. 5A. Ring-gate geometry 500 may include many of the elements included in ring-gate geometry 400 of FIG. 4 and discussed above. So that these elements are not repeatedly discussed, elements that are numbered "5XX" in FIG. 5A correspond to elements numbered "4XX" of FIG. 4 if they are labeled with the same "XX".

Ring-gate geometry 500 may be fabricated to include a first metal layer 524 in contact with N+ source region 553. Accordingly, second metal layer 526 may be fabricated to contact N+ drain region 563. Dielectric layer 525 may be present in ring-gate geometry 500 to separate first metal layer 524 from second metal layer 526. Yet, in ring-gate geometry 500, a gate shield has still not been fabricated and the problem of the localized stressing found in ring-gate geometry 400 still exists.

Figure 5B:
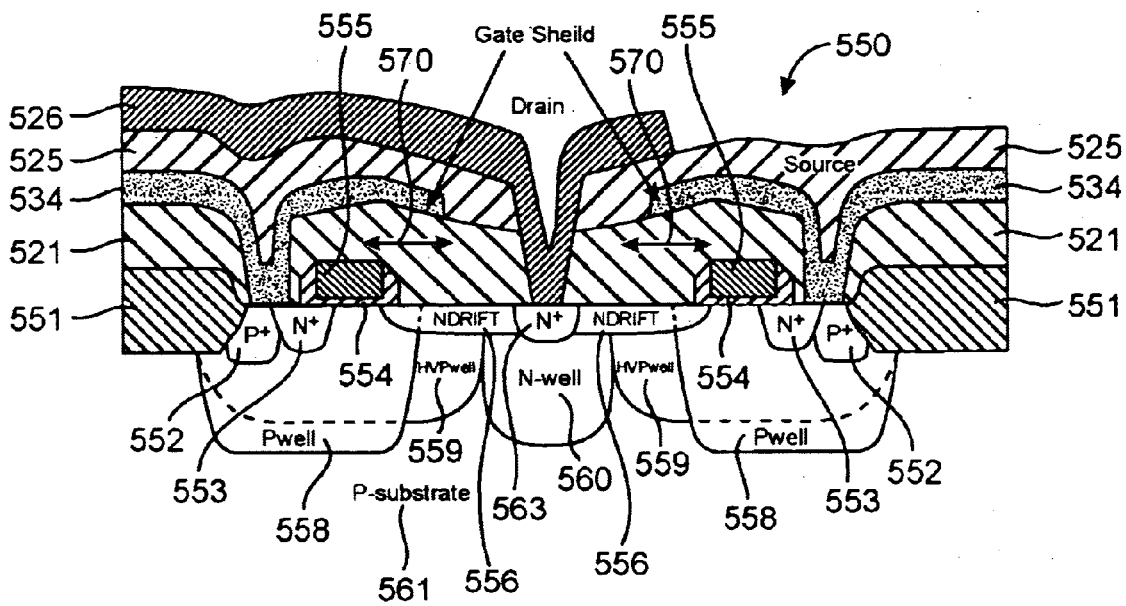
FIG. 5B is a cross sectional view of an VHVNMOS transistor having a ring-gate geometry fabricated with two metal layers in a gate shielding configuration constructed in accordance with the principles of the present invention.

FIG. 5B is a ring-gate geometry 550 with two metal layers and a gate shield. Ring-gate geometry 550 is similar to ring-gate geometry 500, but includes a gate shield fabricated by first metal layer extension 570. Gate shield 570 extends over N-drift 556, HV P-well 559, and P-well 558. Gate shield 570 may reduce the peak electric field at the drain side of the gate as well as the gate-drain capacitance, thus increasing performance and stability. Moreover, localized stressing in gate 555 may become less problematic with the fabrication of gate shield 570 which, may have, for example, a lateral distance of 1 to 3 microns.

Gate shield 570 also may increase the gate-source input capacitance in transistor 500. However, this increase may be insignificant to the operation of transistor 550, because the gate-source input capacitance of transistor 550 is already large due to the presence of the thin gate-oxide. Transistors with a thinner gate-oxide layer have higher input capacitance. Another advantage found by including gate shield 570 in transistor 550 is that gate shield 570 reduces substrate current up to five times the normal value, thus increasing the performance and operating voltage limits of transistor 550.

Although a minimum width W is possible for a transistor in a ring-gate geometry, it may be large. In particular, the width W of a ring device is the inside periphery of the gate silicon structure. Therefore, the ring gate structure has four sides. A gate structure with four sides has a relatively large minimum W, where W is the width of the device. Ultra low current cannot be achieved because the device is relatively big compared to striped devices. If a gate shield is fabricated in a ring-gate geometry, the transistor must be implemented in two metal layers, thus possibly increasing size, routing complexity, and production costs.

Figure 6:
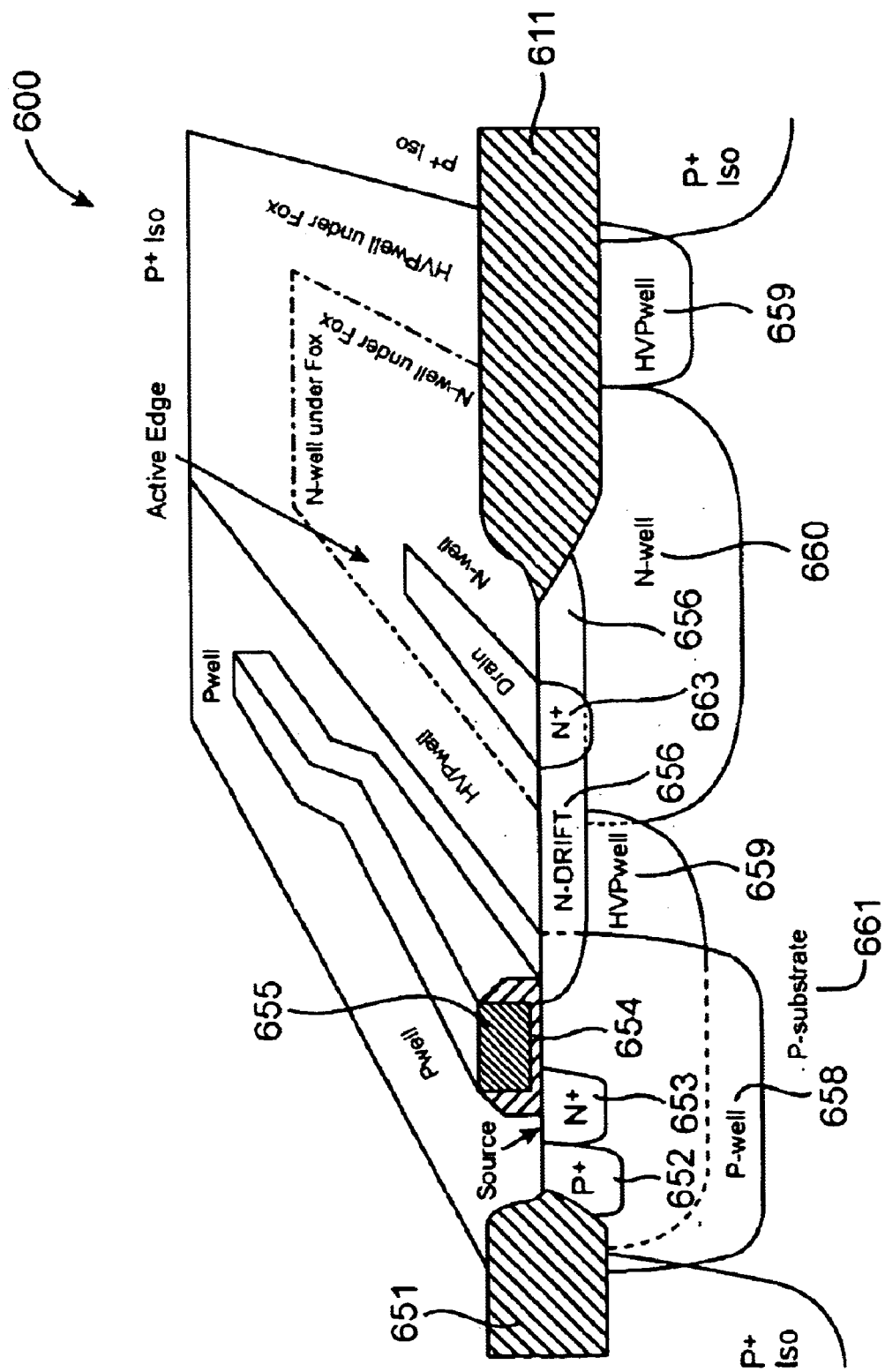
FIG. 6 is a partial sectional view, partial three-dimensional illustration of an VHVNMOS transistor having a striped geometry constructed in accordance with the principles of the present invention.

Some of the disadvantages of a VHVNMOS transistor fabricated with a ring-gate geometry may be overcome with the formation of a transistors with striped-gate geometry 600 as shown in FIG. 6. Striped-gate geometry 600 may include many of the elements included in ring-gate geometry 300 of FIG. 3 and discussed above. So that these elements are not repeatedly discussed, elements that are numbered "6XX" in FIG. 6 correspond to elements numbered "3XX" of FIG. 3 if they are labeled with the same "XX". Differences in elements present in both FIG. 3 and FIG. 6 may exist, which may be described below.

Striped-gate geometry 600 includes gate polysilicon 655 and gate oxide 654 that form linear gate fingers, or stripes. N-well 660 in geometry 600 extends outside of N+ drain contact region 663 under field oxide 611. HV P-well buffer 659 may be positioned around N+ drain region 663, N-drift 656, N-well 660, and any P+ isolation regions not included in FIG. 6.

HV P-well 659 forms a "buffer" or Guard-ring that is placed between N-well 660 and the P+ isolation region. HV P-well 659 increases the drain to substrate breakdown voltage, which increases performance. To increase performance even further, polysilicon may be placed over field oxide 611, aligned with HV P-well 659, and tied to the transistor's body contact to form a field plate. Striped geometry 600 also eliminates the drain-source ON-resistance $R_{DS(ON)}$ shift that occurs in ring gate geometries and decreases drain-source on-resistance $R_{DS(ON)}$.

Figure 7A:
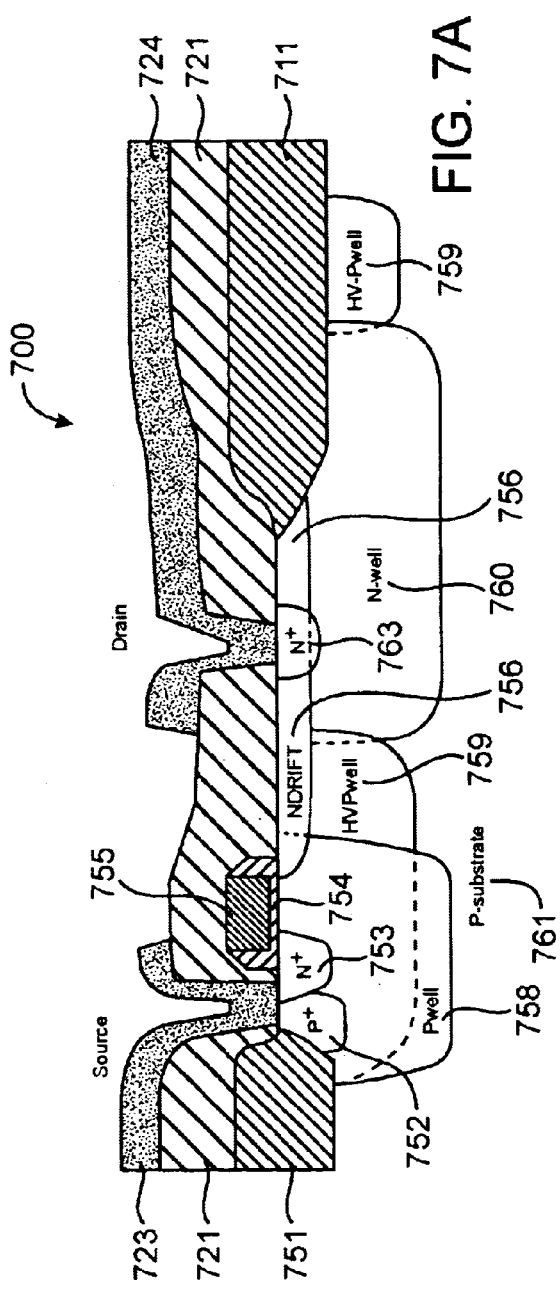
FIG. 7A is a cross sectional view of an VHVNMOS transistor having a striped geometry fabricated with a single metal layer constructed in accordance with the principles of the present invention.

FIG. 7A illustrates a striped-gate geometry 700 fabricated with a single metal layer. Striped-gate geometry 700 may include many of the elements included in ring-gate geometry 400 of FIG. 4 and discussed above. So that these elements are not repeatedly discussed, elements that are numbered "4XX" in FIG. 4 correspond to elements numbered "7XX" of FIG. 7A if they are labeled with the same "XX".

Striped-gate geometry 700 includes a single gate-stripe gate formed from polysilicon 755 and gate oxide 754. A source contact is formed by the connection of first metal layer segment 723 to N+ source region 753 and a drain contact is formed by the connection of first metal layer segment 724 to N+ drain region 763.

Persons skilled in the art will appreciate that a gate shield may be included in striped-gate geometry 700 by extending first metal layer segments 723 and 724. As a result, a gate shield may be fabricated without a second metal layer.

Figure 7B:
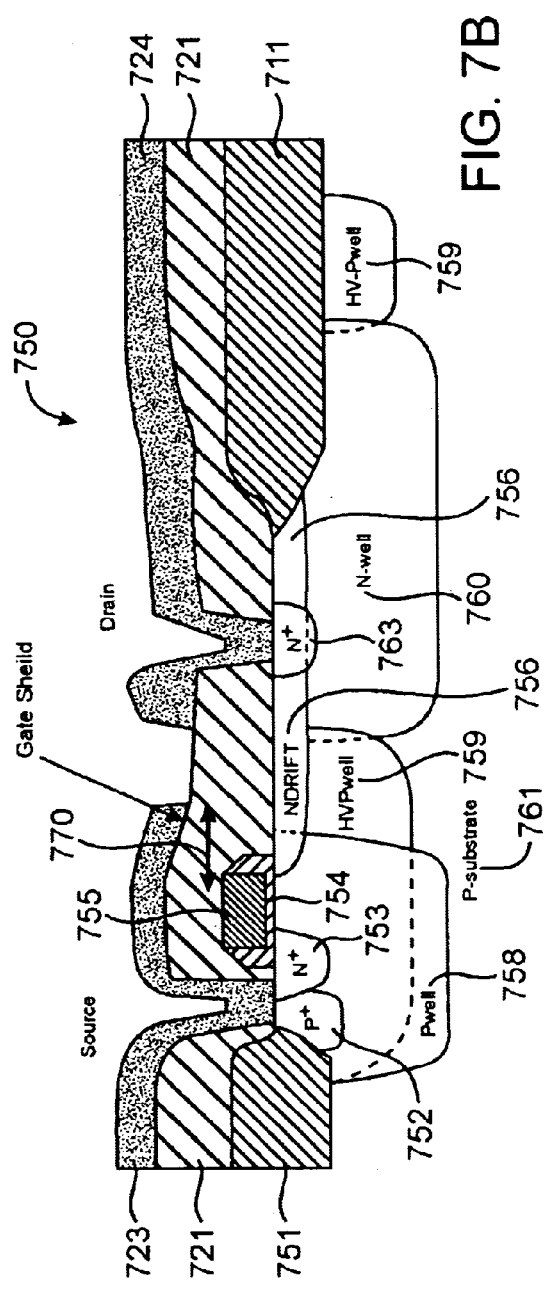
FIG. 7B is a cross sectional view of an VHVNMOS transistor having a striped geometry fabricated with a single metal layer in a gate shielding configuration constructed in accordance with the principles of the present invention.

A striped-gate geometry 750 is depicted in FIG. 7B in which a gate shield may fabricated using a single metal layer. Gate shield 770 is formed by an extension of first metal layer 723 over the drain extension. Gate shield 770 may have a distance of, for example, 1 to 3 microns. Like the gate shield in ring-gate geometries, gate shield 770 reduces the peak electric field at the drain side of gate 755 and reduces the gate-drain capacitance, increasing performance and stability. Because only a single metal layer is needed, production costs remain low.

Figure 8:
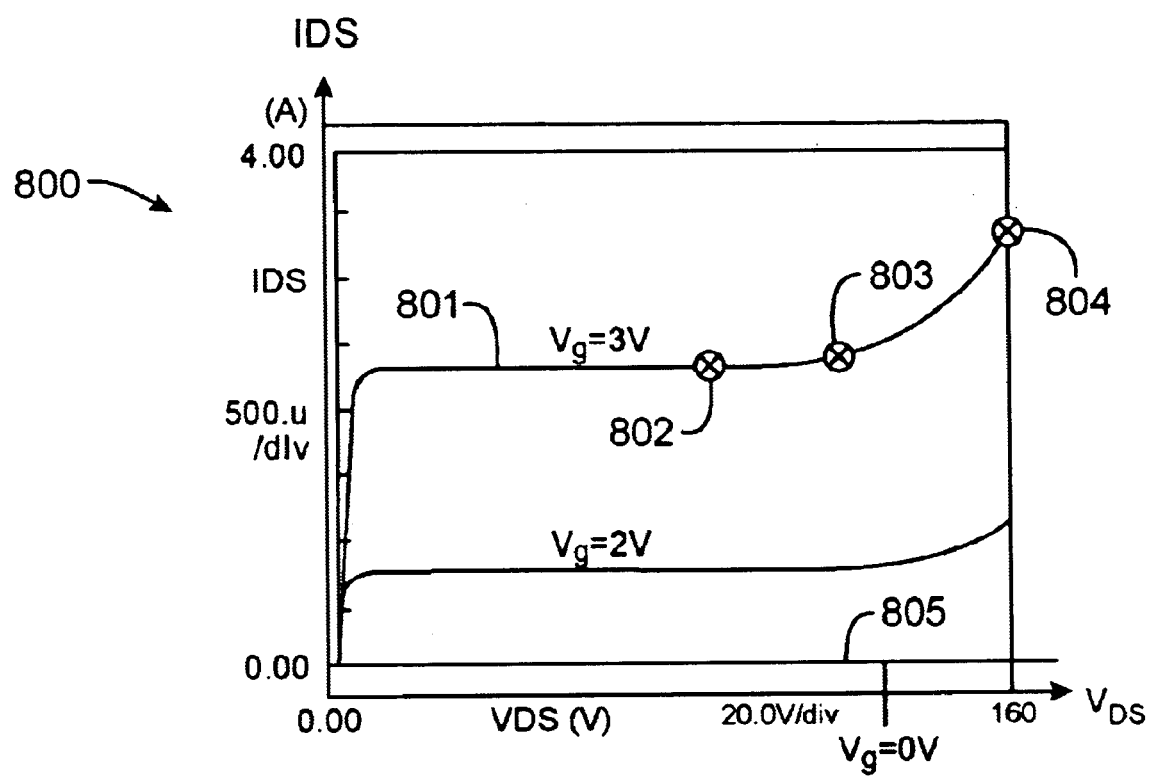
FIG. 8 is a graph of the drain source current $I_{DS}$ versus drain source voltage $V_{DS}$ characteristics of an VHVNMOS transistor having a ring-gate formation constructed in accordance with the principles of the present invention.

Drain-source current $I_{DS}$ versus drain-source voltage $V_{DS}$ characteristics for a very high voltage NMOS (VHVNMOS) transistor fabricated with a ring-gate geometry is illustrated in graph 800 of FIG. 8. Graph 800 helps to illustrates that drain source breakdown voltage $BV_{dss}$ for a transistor with a ring-gate geometry may exceed 160 volts.

In curve 805, the gate voltage $V_G$ of the ring-gate transistor is at a constant voltage of 0 volt. In curve 801, the transistor has a gate voltage $V_G$ equal to 3 volts. Curve 801 includes point 802, at which drain-source current $I_{DS}$ equals 2.257 mA and drain-source voltage $V_{DS}$ equals 90 volts.

At point 803 in curve 801, the drain-source current $I_{DS}$ equals 2.3279 mA and the drain-source voltage $V_{DS}$ equals 120 volts. This data confirms that the transistor is stable for applied voltages up to 120 volts, because the increase in drain current is minimal. The transistor is stable up to about 120 volts (at point 803 in curve 801). The increase in drain-to-source current $I_{DS}$ for a fixed gate voltage when the drain voltage is greater than 120 volts is due to impact ionization. Transistors of the present invention can, for example, have a breakdown voltage $BV_{dss}$ between 150 and 200 volts.

The ring-gate and striped-gate transistors of the present invention have a charge carrier gradient that shifts the gate's electric field away from the gate towards the drain. This shift increases the maximum breakdown $BV_{dss}$ voltage. Both the ring-gate and striped-gate transistors are compatible with standard CMOS and BiCMOS fabrication processes.

FIGS. 9A–9L are sectional views of process steps for the fabrication of a high voltage VHVNMOS transistor in accordance with the principles of the present invention. In a further embodiment of the present invention, a very high voltage PMOS transistor with a triple drain extension may be made by providing substrate, source, drain, and well regions of the opposite doping type as those shown in FIGS. 9A–9L.

Figure 9A:
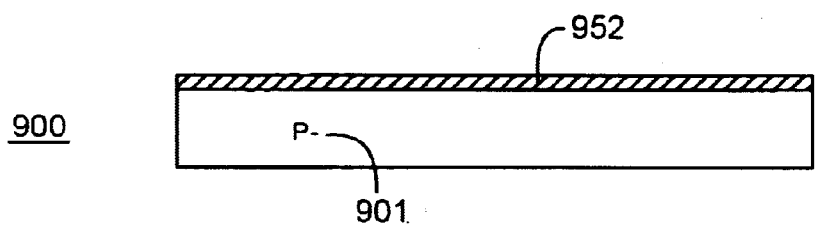
FIGS. 9A–9L are cross sectional views of fabrication process steps for producing a VHVNMOS transistor with a triple drain extension constructed in accordance with the principles of the present invention.

Wafer 900 shown in FIG. 9A comprises a P-type doped semiconductor wafer. Wafer 900 may be chosen based on attributes such as surface orientation (e.g., crystal type) and resistivity (e.g., silicon P-type, 10—20 ohm-cm). These attributes all affect design and device properties. For example, if a higher breakdown voltage is needed, a wafer with higher resistivity may be used. A portion 901 of wafer 900 is shown in FIG. 9A.

A standard oxidation step may be performed on wafer 900 to grow screen oxide 952. This standard oxidation step may be accomplished in a high-temperature furnace, for example, for 15 minutes at 1150° C. in $H_2O$. Oxide layer 952 may have a thickness of 10K Å. Other wafer preparation steps may include, for example, wafer cleaning and marking.

Persons skilled in the art will appreciate that if other devices need to be fabricated on wafer 900, additional processes may occur before, after, and during the fabrication processes discussed herein. Additionally, the initial oxidation process step is not needed to implement the VHVNMOS transistor of the present invention. Rather, the above process step is merely an initial preparation of wafer 900.

Figure 9B:
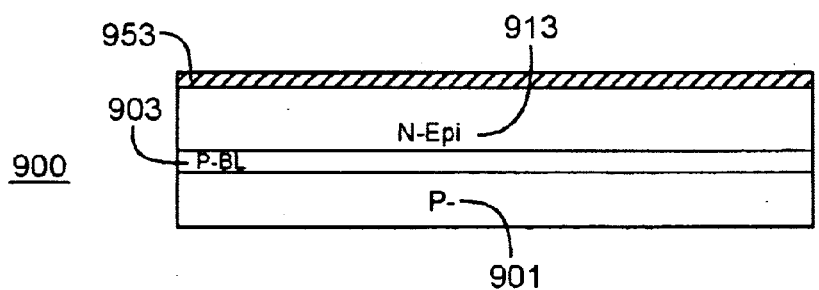

A P-type buried layer 903 may be formed in wafer 900 as shown in FIG. 9B. Buried layer 903 may be used as a link between the P-well and HV P-wells of the VHVNMOS transistor to avoid any floating or unbiased regions between the P-wells of the transistor and the substrate. The fabrication of P-type buried layer 903 is advantageous, but not essential, when fabricating a transistor in accordance with the principles of the present invention. In a further embodiment, buried layer 903 may be omitted entirely.

Buried layer 903 may, for example, be formed using a blanket implant of Boron between $1 \times 10^{12}$ to $1 \times 10^{13}$ atoms/$cm^2$, at an implant energy of 160 KeV. No mask is used to form buried layer 903.

An anneal step may or may not be used to form buried layer 903 at low implant doses. For higher doses, an anneal step may be implemented in a furnace or rapid thermal processor. Examples of appropriate anneal processes are between 900–1100° C., from 10 seconds to 30 minutes, in a nitrogen or argon ambient.

If any oxide is present on wafer 900, the oxide may be removed with an etch or strip process after buried layer 903 is formed. An epitaxial growth process may then be performed on wafer 900 to form N-type epitaxial layer 913 as shown in FIG. 9B. Epitaxial layer 913 may, for example, be doped with Arsenic or Phosporous, at a doping concentration of $1 \times 10^{15} - 3 \times 10^{15}$ atoms/$cm^2$, and have a thickness of 2–12 microns. A specific example of the thickness of layer 913 is 6 microns.

An oxidation step is performed to form screen oxide 953 on the epitaxial surface (e.g., at 900° C.). Oxide 953 may, for example, have a thickness of 200–800 Å.

Wafer 900 is masked using nitride layer 904. Nitride layer 904 is deposited and patterned using a photoresist mask as shown in FIG. 9C.

Figure 9C:
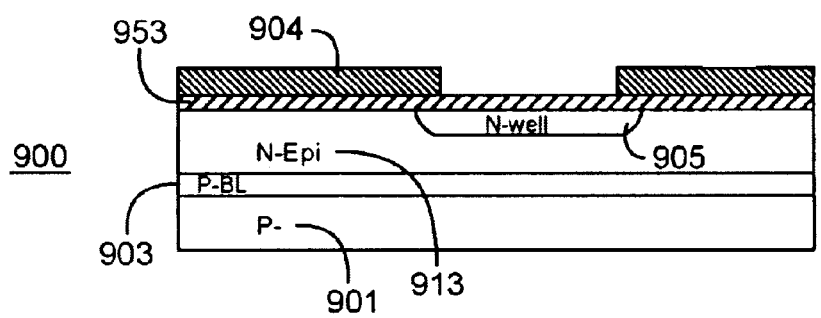

Subsequently, N-type well region 905 is formed in wafer 900 as shown in FIG. 9C. N-type dopant is implanted and driven into the epitaxial layer to form N-well region 905. For example, N-type dopant may be implanted at a dose of $1.5 \times 10^{12} - 3.5 \times 10^{12}$ atoms/$cm^2$, at an energy level of 170 KeV, and a temperature of 950–1150° C. to form N-well 905. Nitride layer 904 masks the formation of N-well 905.

Figure 9D:
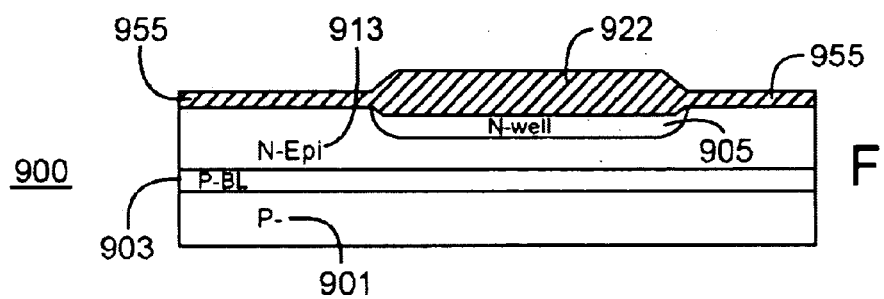

After N-well 905 is driven into the substrate, a 2000 Å–5000 Å layer 922 of thick oxide may be grown above N-well 905, as shown in FIG. 9D. After the furnace drive, mask 904 may be removed from wafer 900 through, for example, a stripping or etching step. N well 905 may extend, for example, 7–18 microns beyond the subsequently formed N+ drain contact region.

Figure 9E:
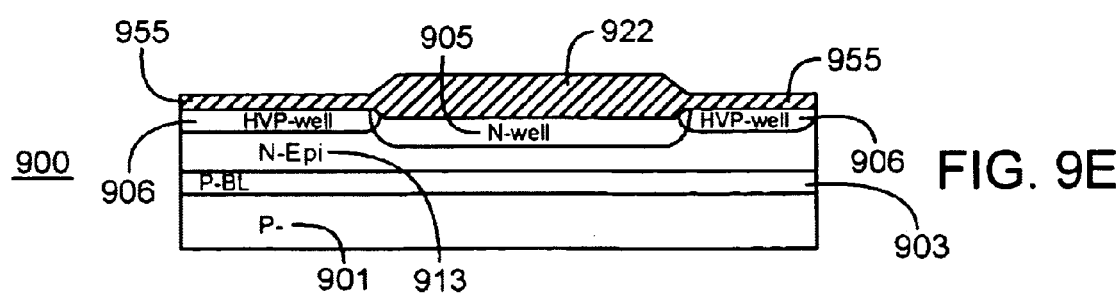

FIG. 9E illustrates high voltage (HV) P-wells 906 in wafer 900. Boron may be implanted, for example, at a dose in the range of $8 \times 10^{11} - 3 \times 10^{12}$ atoms/$cm^2$ and at an energy of 30 KeV to form P-wells 906. HV P-wells 906 are self-aligned with thick oxide 922. Persons skilled in the art will appreciate that the energy of the boron dose should be high enough to overcome thin oxide 955, but not high enough to overcome thick oxide 922. Alternatively, P-well 906 may be masked using photoresist.

Figure 9F:
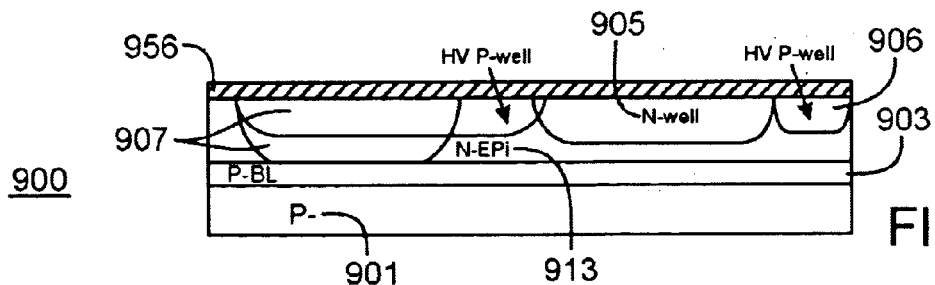

Following the formation of HV P-well 906, a clear field mask (photoresist) is patterned such that the HV P-well regions 906 are covered or protected and all other regions are exposed. Subsequently, P-well 907 is formed in wafer 900 as shown in FIG. 9F. For example, boron may be masked and implanted at a dose in the range of $5 \times 10^{12} - 1.5 \times 10^{13}$ atoms/$cm^2$ at an energy level of 30 KeV to form P-well 907.

P-well 907 may extend down from oxide 956 to P-buried layer 903 as shown in FIG. 9F. In another embodiment, the mask layer used to form P-well 907 may be formed so that in the final transistor layout, P well 907 lines up with the drain side of the gate and is between 1.5–5 microns from the N+ drain contact region.

P-well 907 partially overlaps one of HV P-wells 906. The area of overlap between HV P-well 906 and P-well 907 has a net P-type doping concentration equal to the P-type doping concentration of P-well 906 plus the P-type doping concentration of P-well 907.

Persons skilled in the art will appreciate that an anneal or furnace drive may be used to obtain the appropriate junction depth and surface concentration of a well in wafer 900. As a result of the anneal, wells in wafer 900 may deepen and go further away from the surface of wafer 900. Surface ion concentration may decrease, causing threshold voltages associated with the wells to also decrease because less electric field now has to be overcome. Anneal steps may be used to control threshold voltages in devices included in wafer 900. One possible furnace process may involve, for example, a furnace with a nitrogen atmosphere at 1200° C., in which wafer 900 is placed in the furnace for 150 minutes.

Persons skilled in the art will also appreciate that the process steps shown in FIGS. 9A–9L may be ordered differently. For example, instead of fabricating HV P-well 906 before P-well 907, P-well 907 may be fabricated before HV P-well 906.

Figure 9G:
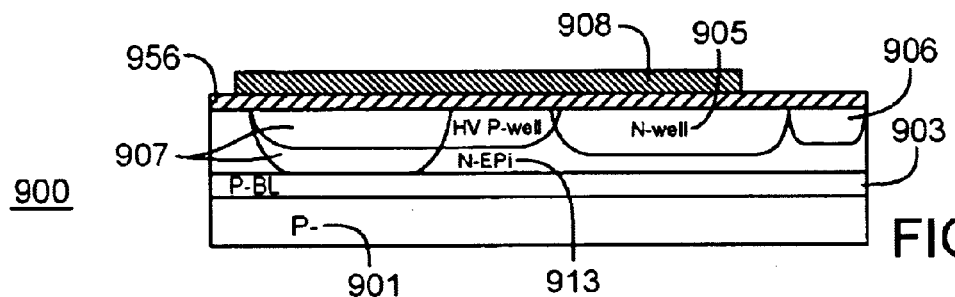

All of the oxide layers are then removed from wafer 900, and a new oxide layer 956 is grown. A nitride layer 908 is then deposited and patterned onto wafer 900 as shown in FIG. 9G. Nitride layer 908 is patterned by using a photoresist mask (not shown) and a dry plasma etch process. Nitride 908 defines the active area of the transistor.

Figure 9H:
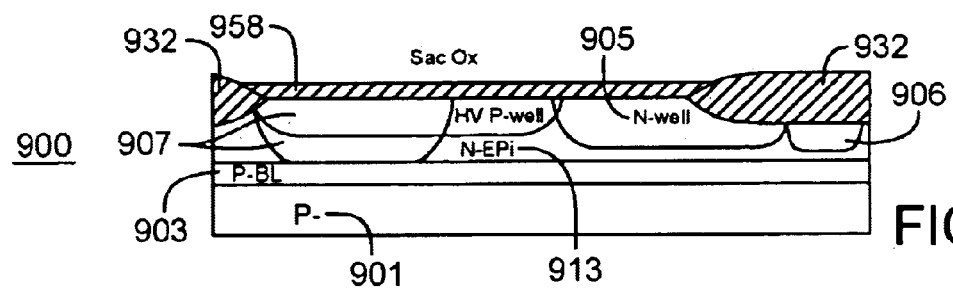

Wafer 900 may then be cleaned and placed in a furnace to form field oxide regions 932 using a local oxidation of silicon (LOCOS) scheme, as shown in FIG. 9H. Silicon nitride has a slower oxidation rate in $O_2$ or $H_2O$, than in the surrounding regions, which results in a thicker oxide 932.

After the oxidation step is complete, the rest of mask layer 908 may be stripped or etched away, for example, using hot phosphoric acid. Thin oxide 958 may then be etched, and a thin sacrificial oxide may be grown, for example, between 200 Å and 700 Å. This sacrificial oxide is then etched again before gate oxidation in order to obtain a clean silicon surface on wafer 900 without any nitride residue. The gate oxide may be, for example, between 100 Å and 700 Å.

Optional threshold mask implant and implant steps may be performed in conjunction with the present invention to change the threshold voltage of the transistor. For example, Boron may be implanted at a dose of $1\times10^{11}$ to $2\times10^{12}$ at 30 KeV.

Figure 9I:
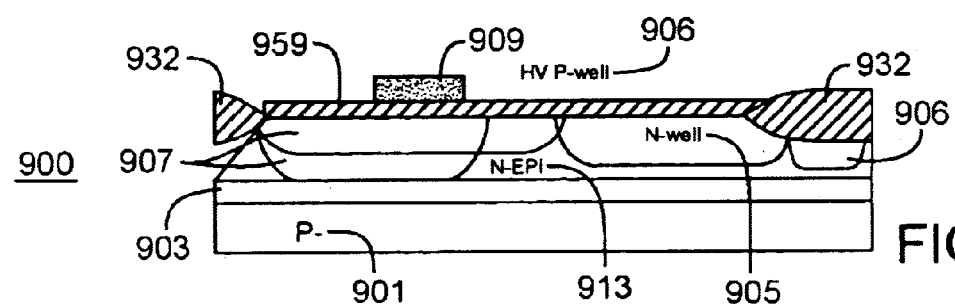

Gate electrode polysilicon 909 on wafer 900 and gate oxide 959 is illustrated in FIG. 9I. Polysilicon 909 may be deposited over the entire surface of wafer 900. The thickness of gate 909 may be, for example, 0.1–0.6 microns.

Polysilicon 909 may, for example, be doped with unmasked N+ ion implants, or through furnace steps using $POCl_3$ as a dopant source. This polysilicon 909 doping is necessary to produce low sheet resistance polysilicon layers and subsequently low gate resistance in transistors. Alternatively, the formation of a gate on wafer 900 may comprise polycide deposition such as $WSi_x$ on top of polysilicon.

Examples of an ion implant for polysilicon 909 may be, for example, a phosphorus or arsenic implant. The implant energy for polysilicon 909 may have any value as long as it is not strong enough to penetrate into the elements below polysilicon 909. Persons skilled in the art will appreciate that this implant ionization step may also occur during the actual deposition of polysilicon 909. Wafer 900 may then be heated in a furnace or anneal step in order to spread the implant throughout polysilicon 909 uniform.

A photoresist layer and an etching process may be used to define polysilicon 909. After the polysilicon 909 is etched, the photoresist layer used to pattern polysilicon 909 may also be removed. An optional threshold voltage implant may be performed at this time.

Figure 9J:
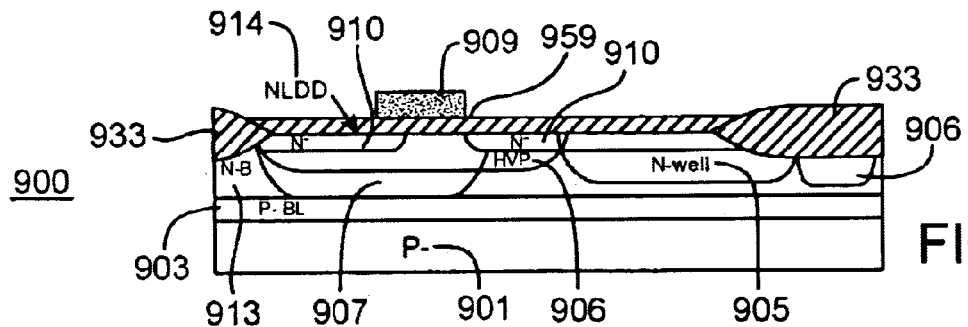

N-type extension regions 910 may be formed in wafer 900 as shown in FIG. 9J. The wafer is masked and N− type dopant is implanted to form N− extension regions 910. For example, phosphorus may be implanted with a dose in the range of $1\times10^{12}$ to $5\times10^{14}$ atoms/cm$^2$, at an energy level between 60 KeV and 120 KeV. A preferred implant dose is $2\times10^{12}$ atoms/cm$^2$ at 120 KeV. The energy of the implant dose used to form extension regions 910 is selected so that dopant does not penetrate gate layer 909. The thickness of extension regions 910 should be less than the thickness of polysilicon gate 909.

After extension regions 910 are formed, the mask is stripped and the wafer is cleaned. An anneal process may be used to diffuse N− extension regions 910. An example of such an anneal process involves placing wafer 900 in a nitrogen atmosphere for 30 minutes at 1000° C. Oxidation may also occur in order to form oxide regions 933.

FIG. 9J also illustrates N-type low doped region (NLDD) 914. NLDD 914 may be formed with a mask and an implant of N-type dopant. For example, phosphorus can be implanted with an energy of 50 KeV at a dose in the range of $5\times10^{12}$ atoms-/cm$^2$ to $1\times10^{14}$ atoms/cm$^2$ to form NLDD 914. A preferred implant dose is $2\times10^{13}$ atoms/cm$^2$.

Typically, the NLDD is implanted on the source side of any transistors being fabricated on wafer 900. The NLDD implant may be blocked from forming in the drain extension region. After the NLDD implant, the mask may be stripped, and wafer 900 cleaned.

Figure 9K:
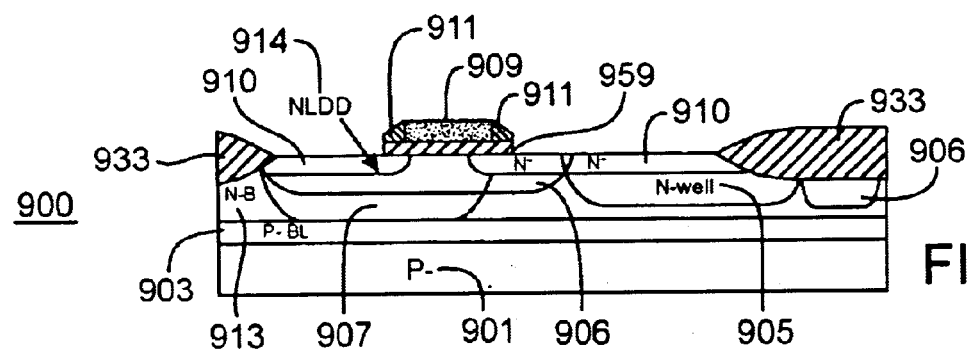

FIG. 9K illustrates the formation of oxide sidewall spacers 911. Sidewall spacers 911 may be formed using conformal oxide deposition to a thickness of, for example, 1000–6000 Å, followed by oxide etching. A vertical or anisotropic etch technique is used to remove oxide 902 from unwanted areas and to form the spacers along the periphery of the gate electrodes.

Figure 9L:
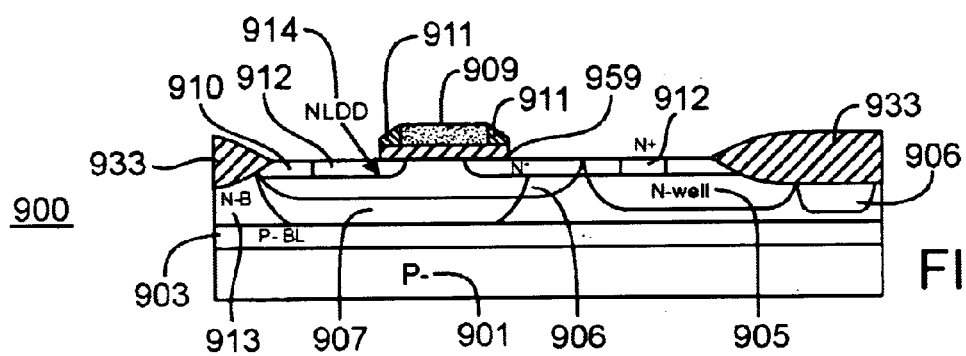

FIG. 9L illustrates the formation of highly doped drain and source contact N+ regions 912 through shallow N+ diffusion. N+ regions 912 may be formed using an N+ mask followed by a N+ implant. One example of an N+ implant that may be used is an arsenic implant having energy ranging from 80 KeV to 180 KeV with an implant dose ranging from $1\times10^{15}$ atoms/cm$^2$ to $1\times10^{16}$ atoms/cm$^2$. A preferred implant dose is $6.5\times10^{15}$ at 150 KeV. N+ drain contact region 912 may, for example, be 0–5 microns from the edge of the active area of the device. Wafer 900 may then be stripped of the N+ resist mask and cleaned.

Wafer 900 may then be completed with a variety of process steps. These process steps may include, for example, P+ source and drain diffusion (for a NMOS body contact and for PMOS source and drain regions), borophosphatesilicate glass (BPSG) deposition, BPSG flow, contact masking, and metalization. Furthermore, variations in the standard fabrication processes may be used in instead of or in addition to those discussed in the fabrication of wafer 900. Moreover, additional layers and appropriately doped regions may be added to wafer 900. For example, metal layers may be deposited on wafer 900 to create logic circuitry with another device.

P-wells and N-wells may be added to or removed from the drain extension of the transistor of the present invention to modify the number of extensions in the transistor's drain region. For example, if a properly doped well is added to the triple drain extension of NMOS transistor 200 in FIG. 2A at the proper location, a quad drain extension may be formed.

If a properly doped well is removed from the triple drain extension of the present invention at the proper location, a dual drain extension may be formed. Modifying the number of extension regions in the transistor's drain region may effect, for example, the amount of N-charge in each extension region, the change in N− charge between the regions, the length of each extension region, and the length of the drain region.

Figure 10:
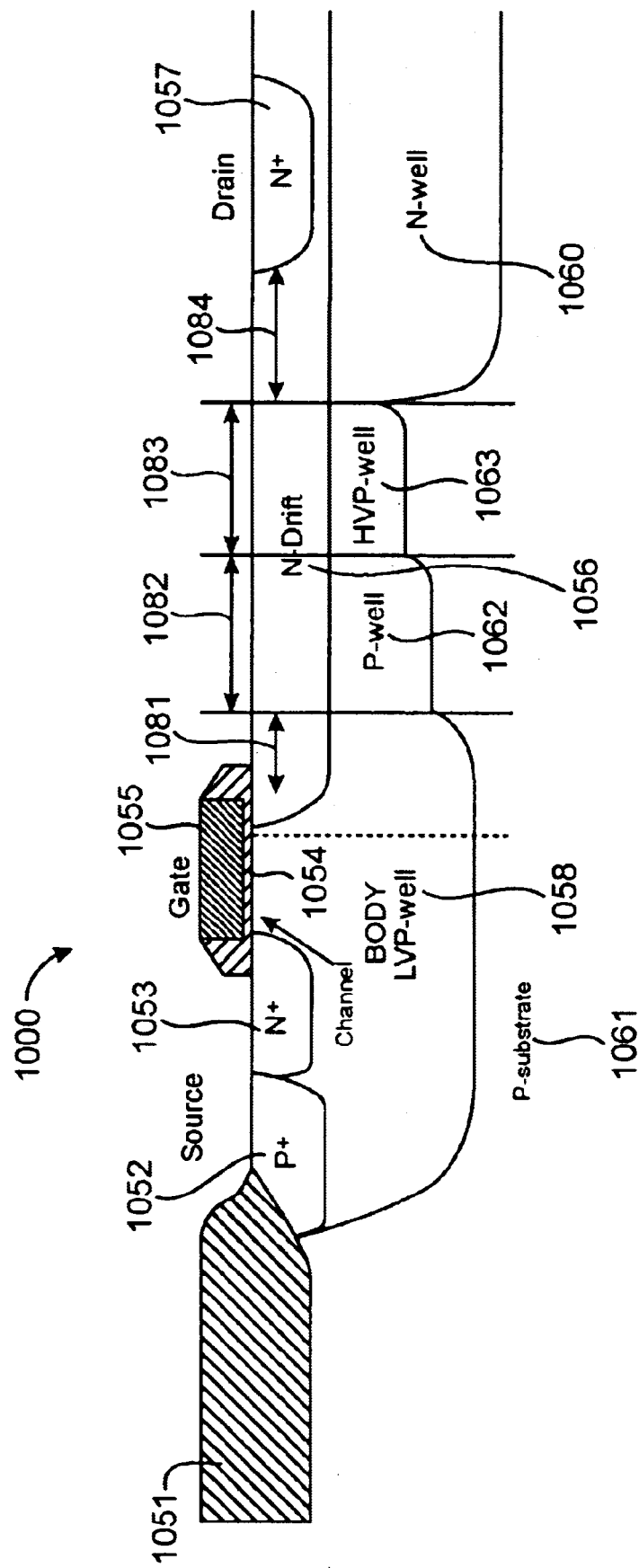
FIG. 10 is a cross sectional view of an VHVNMOS transistor fabricated with a quad drain extension having an extra P-well constructed in accordance with the principles of the present invention.

FIG. 10 is a sectional view of an VHVNMOS transistor 1000 fabricated with a quad drain extension having an extra P-well extension. Transistor 1000 may be formed to include, from left to right in FIG. 10, field oxide 1051, P+ body contact region 1052, N+ source region 1053, low voltage (LV) P-well 1058, gate oxide 1054, gate 1055, N-drift 1056, P-well 1062, high voltage P-well 1063, N-well 1060, and N+ drain contact region 1057. All of these regions are formed in P-substrate 1061.

Persons skilled in the art will appreciate that the quad drain extension of transistor 1000 may be formed by including a properly doped P-well 1062 in the drain region of transistor 1000. P-well 1062 may have a p-type doping concentration between the p-type doping concentrations of LV P-well 1058 and HV P-well 1063, such that n type charge is gradually graded in N draft 1056 between the extensions from gate 1055 to drain 1057.

The four extension regions of transistor 1000 are as follows. First extension 1081 begins under gate 1055 and gate oxide 1054 and is formed by N-drift 1056 diffusion into LV P-well 1058. Second extension 1082 is formed by N-drift 1056 diffusion into P-well 1062. Third extension 1083 is formed by N-drift 1056 diffusion into HV P-well 1063. Fourth extension 1084 is formed by N-drift 1056 diffusion into N-well 1060 over P-substrate 1061, ending at N+ drain contact 1057.

The N-type charge increases from first extension 1081 to fourth extension 1084. The increase in N charge in the drain extension regions is caused by the diffusion of N-type dopant in drift region 1056 into wells 1058, 1062, 1063, or 1060. Each of wells 1058, 1062, 1063, and 1060 have a different N or P type doping concentration that either adds to subtracts from the net n-charge in regions 1081–1084 of drift region 1056.

An increase in N-charge across a quad drain extension from the gate to the drain contact can be obtained by properly selecting the doping concentration in the wells that overlap N drift region 1056. Any number of wells in any location may be used to form a quad drain extension of the present invention. In addition, any number of extension regions may be formed in transistor 1000 by simply including an appropriate number of properly doped wells into which N-drift 1056 diffuses, or vise versa, such that N charge gradually increased from gate 1055 to drain 1057.

Figure 11:
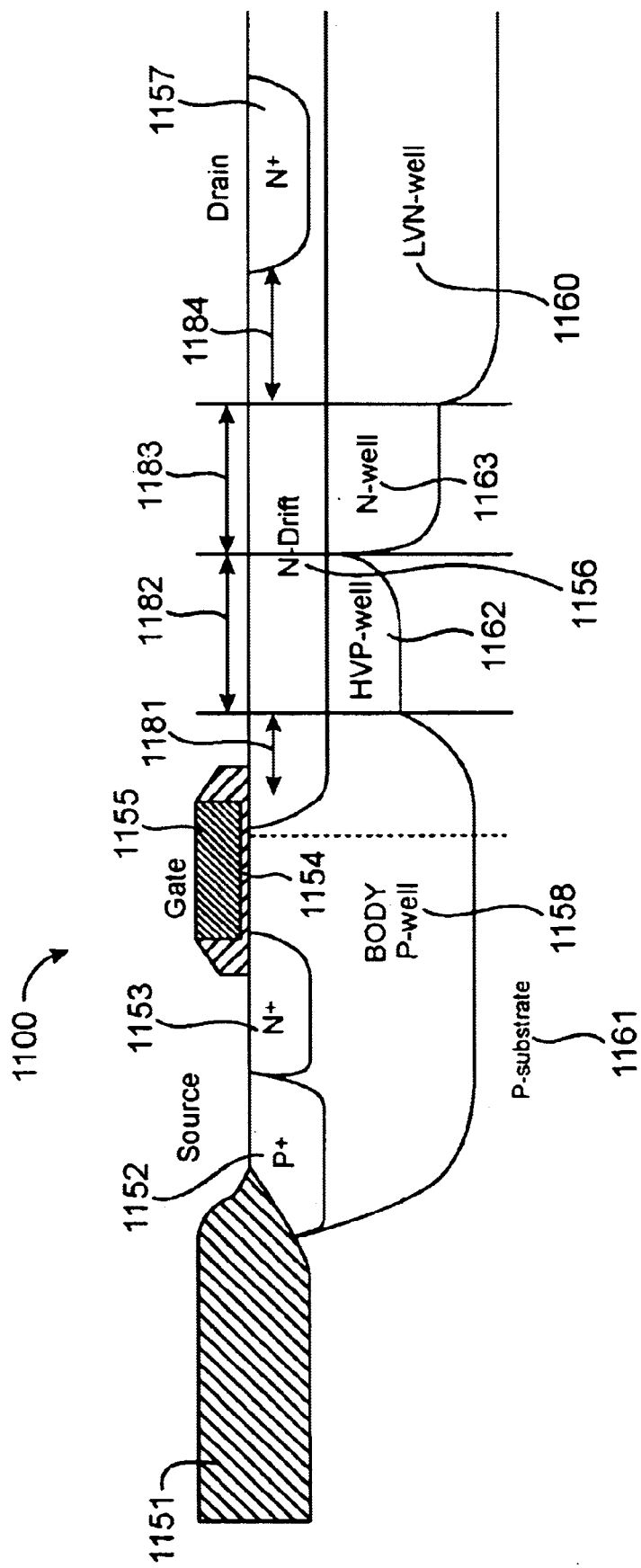
FIG. 11 is a cross sectional view of an VHVNMOS transistor fabricated with a quad drain extension having an extra N-well constructed in accordance with the principles of the present invention.

FIG. 11 is a sectional view of an VHVNMOS transistor 1100 fabricated with a quad drain extension having an additional N-well extension. Transistor 1100 may be formed to include, from left to right in FIG. 11, field oxide 1151, P+ body contact region 1152, N+ source region 1153, P-well 1158, gate oxide 1154, gate 1155, N-drift 1156, high voltage P-well 1162, N-well 1163, low voltage (LV) N-well 1160, and N+ drain region 1157. These regions are formed on P-substrate 1161.

The four extension regions of transistor 1100 are as follows. First extension 1187 begins under gate 1155 and gate oxide 1154 and is formed from N-drift 1156 diffusion into low voltage P-well 1158. Second extension 1182 is formed from N-drift 1156 diffusion into P-well 1162. Third extension 1183 is formed from N-drift 1156 diffusion into N-well 1163. Fourth extension 1184 is formed from N-drift 1056 diffusion into LV N-well 1160, ending at N+ drain contact 1157. Additionally, N-well 1163 has an n-type doping concentration less than LV N-well 1160.

A transistors of the present invention may have a dual extension region. One reason to fabricate a transistor with a dual extension may be to decrease the amount of well implants needed. Decreasing well implants reduces the number of process steps and ultimately the cost of the device.

Another reason to create a dual drain extension may be to decrease the length of the drain region, while maintaining an N− charge gradient between the gate and the drain contact. In decreasing the length of the extension, more devices and ultimately more logic may be formed on a wafer. Like a triple drain extension, a dual drain extension moves the electric field away from the transistor's gate by grading N− charge. The N charge gradient causes the largest concentration of N− charge to be in the extension region farthest from the gate.

Figure 12:
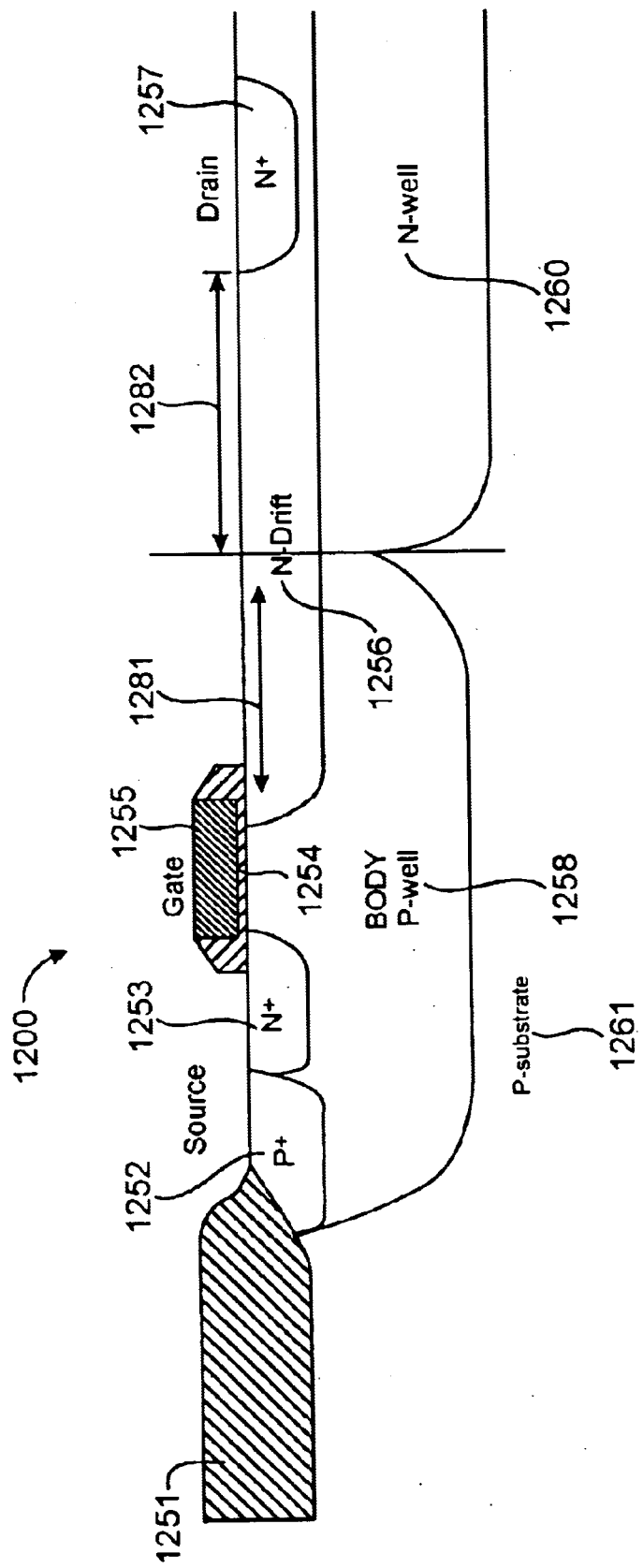
FIG. 12 is a cross sectional view of an VHVNMOS transistor fabricated having a dual drain extension constructed in accordance with the principles of the present invention.

FIG. 12 is a cross sectional view of an VHVNMOS transistor 1200 of the present invention fabricated with a dual drain extension. VHVNMOS transistor 1200 is similar to the VHVNMOS transistor of FIG. 2A, but does not contain a third extension between P-well 1258 and N-well 1260.

Transistor 1200 may be formed to include, from left to right in FIG. 12, field oxide 1251, P+ body contact region 1252, N+ source region 1253, P-well 1258, gate oxide 1254, gate 1255, N− drift region 1256, N− well 1260, and N+ drain region 1257. These regions are formed on P-substrate 1261.

Dual drain transistor 1200 is fabricated with a first extension region 1281 and second extension region 1282. First extension region 1281 is formed by N-drift 1256 diffusion into P-well 1258 and begins under gate 1255. Second extension region 1282 is formed by N-drift 1256 diffusion into N-well 1260 and extends from first extension region 1281 to drain contact 1257.

To accommodate the area where the additional extension region was removed, P-well 1258 and N-well 1260 have been extended. If P-well 1258 an N-well 1260 are both the same length as in the triple drain embodiment and fabricated next to each other, then the total length of the drain extension would decrease.

The N− charge present in P-well 1258 is less than the charge in N− well 1260. By extending P-well 1258, the drain extension region where low N− charge exists is extended farther from gate 1255. As a result, high N− charge extension region 1282 moves farther away from gate 1255. This causes the large electric fields associated with second extension region 1282 to move away from gate 1255.

Figure 13:
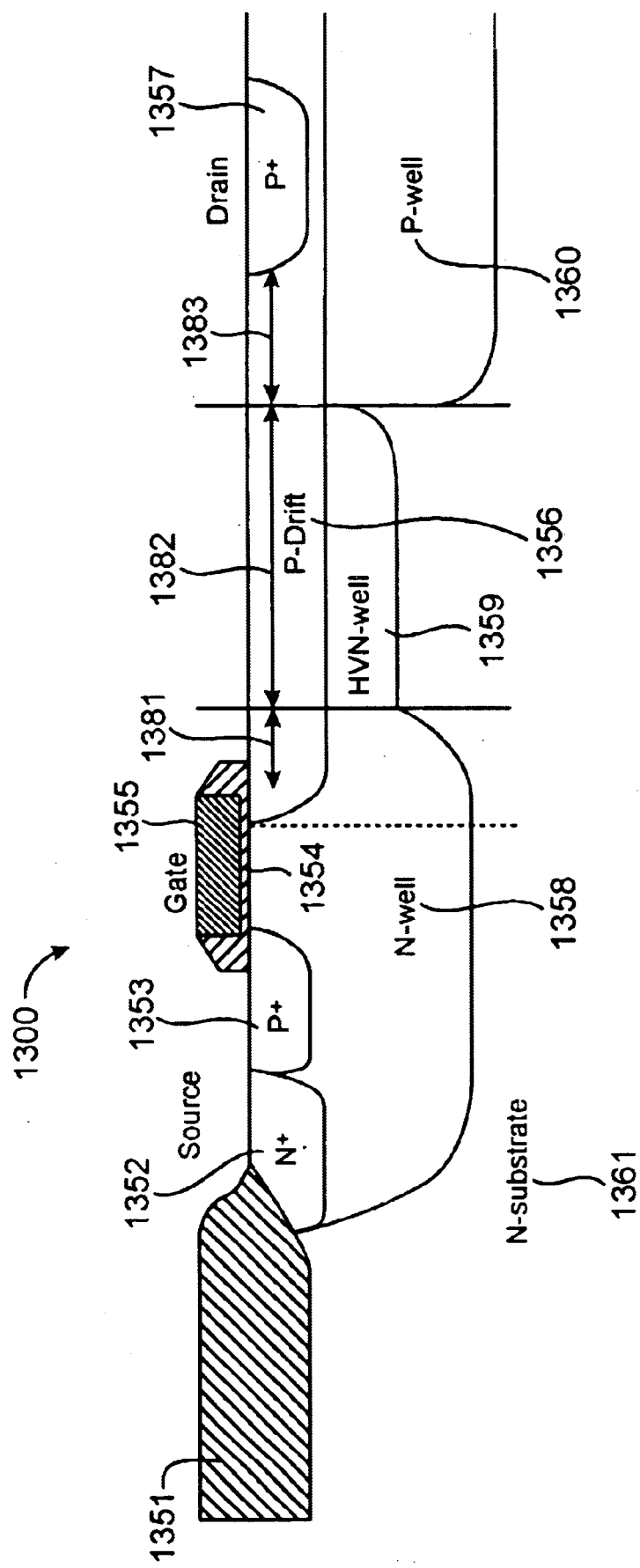
FIG. 13 is a cross sectional view of a very high voltage PMOS (VHVPMOS) transistor constructed in accordance with the principles of the present invention.

Transistors of the present invention may also be fabricated as a very high voltage P channel MOS (VHVPMOS) transistor. FIG. 13 is a sectional view of a triple drain VHVPMOS transistor 1300 fabricated in accordance with the principles of the present invention.

Transistor 1300 may be formed to include, from left to right in FIG. 13, field oxide 1351, N+ body contact region 1352, P+ source region 1353, N-well 1358 (the body of the transistor), gate oxide 1354, gate 1355, P-drift region 1356, high voltage N-well 1359, P-well region 1360, and P+ drain contact region 1357. These regions are formed in N-substrate 1361.

VHVPMOS transistor 1300 has doped regions that correspond to the doped regions of triple drain extension transistor 200 of FIG. 2A. In contract, the doped regions of VHVPMOS transistor 1300 have the opposite doping type compared to the doped regions of NMOS transistor 200. The doping levels for the regions in transistor 1300 are not necessarily the same as the doping levels for transistor 200.

The triple drain extension of VHVPMOS transistor 1300 is formed with three separate extension regions. First extension region 1381 begins with P-drift 1356 diffusion in N-well 1358 underneath gate 1355 and gate oxide 1354. Second extension region 1382 is adjacent to first extension region 1381. Second extension region 1382 is formed by P-drift 1356 diffusion into HV N-well 1359.

HV N-well is similar to N-well 1358 in that it has the same type. However, the doping of HV N-well is lower then that of N-well 1358. P-drift 1356 is therefore not compensated as much as in first extension region 1358.

Third extension region 1383 is formed adjacent to second extension region 1382 and extends to drain contact 1357. Third extension region 1383 is formed by P-drift 1356 diffusion into P-well 1360.

VHVPMOS transistor 1300 may also be fabricated to include additional wells and well configurations not illustrated in FIG. 13. For example, a dual drain extension VHVPMOS transistor may be fabricated. To accommodate the missing extension of such a dual drain VHVPMOS transistor, the rest of the extensions are simply extended. In another example, one may add another properly doped well underneath P-drift 1356 to create a quad drain extension VHVPMOS transistor.

Figure 14:
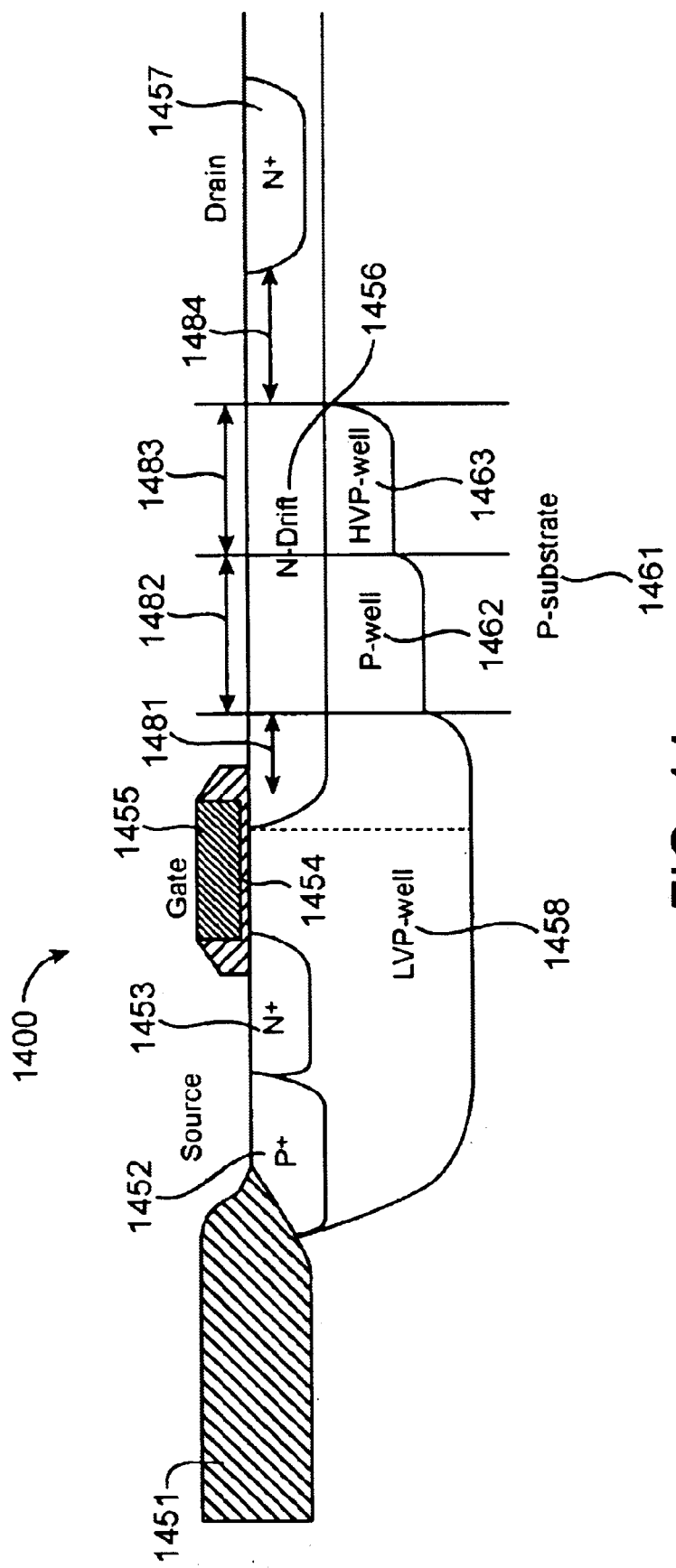
FIG. 14 is a cross sectional view of an VHVNMOS transistor fabricated with a quad drain extension having P-substrate replace a diffusion wells constructed in accordance with the principles of the present invention.

The substrate upon which an NMOS or PMOS transistor is fabricated in accordance with the principles of the present invention may be used as a diffusion component instead of an appropriately doped N-well or P-well. FIG. 14 illustrates NMOS transistor 1400 in which a quad-drain extension is fabricated upon P-substrate 1461. NMOS transistor 1400 is the same as NMOS transistor 1000 in FIG. 10 except that N-well 1060 from NMOS transistor 1000 has been removed. Because P-substrate 1461 has a lower P-type doping level then LV P-well 1458, P-well 1462, and HV P-well 1463, P-substrate 1461 compensates N-drift 1456 less than these other P-type wells.

As a result, fourth extension region 1484 has a higher concentration of N charge than extension regions 1481–1483. Fourth extension 1484 also has the highest electric fields of the four extension regions. P-substrate 1461 may replace any well in NMOS transistor 1400, as long as the wells closer to drain region 1457 have a greater net concentration of N charge. If NMOS transistor 1400 is a PMOS transistor, an N-substrate may be used to compensate the fourth extension region.

The present invention also includes properly grading the doping of the wells beneath the graded extension regions. In NMOS transistor 1400, the regions of wells 1458, 1462, and 1463 beneath extension regions 1481–1483 are graded.

Persons skilled in the art will recognize that the present invention is not limited to the embodiments described above which implement a triple drain transistor to move the electric field away from the source to the drain. Instead, the present invention more generally involves creating a gradual change in doping over a distance in order to manipulate the magnitude of an electric field. Therefore, the principles of the present invention may be used in any MOS device or similar structures.

Persons skilled in the art will appreciate that the apparatus of the present invention may be implemented using processing attributes other than those shown and discussed above. The present invention may be realized using processes other then CMOS and BiCMOS and for process requirements not currently realized. Additionally, the MOSFET of the present invention may be implemented in configurations other then a gate-ring or striped version and may also be manipulated in any way to increase performance. All such modifications are within the scope of the present invention, which is limited only by the claims that follow.

What is claimed is:

1. An integrated circuit comprising a high voltage transistor on a semiconductor, the high voltage transistor comprising:

a source formed in the semiconductor;

a drain formed in the semiconductor; and a channel between the source and the drain, wherein the drain comprises a first drain extension region, a second drain extension region, and a third drain region, a concentration of majority charge carriers in the drain increasing farther away from the channel at junctions between the three drain regions, wherein the drain further comprises a first doped well that overlaps the first drain extension region, the first doped well having a first concentration of dopant that reduces majority carriers in the first drain extension region, and wherein the drain further comprises a second doped well that overlaps the second drain extension region, the second doped well having a second concentration of dopant that reduces majority carriers in the second drain extension region.

2. The integrated circuit of claim 1, further comprising:

a gate formed in a ring structure that encloses the drain.

3. The integrated circuit of claim 1, further comprising:

a gate formed into a striped structure.

4. The integrated circuit of claim 1, further comprising:

a gate shield formed partially over a gate and the drain.

5. The integrated circuit of claim 1 wherein the drain further comprises:

a fourth drain region adjacent to the third drain region that has a concentration of majority charge carriers that is greater than the concentration of majority charge carriers in the first, second, and third drain regions, and wherein the third drain region is a third drain extension region.

6. The integrated circuit of claim 5 further comprising:

a fifth drain region adjacent to the fourth drain region that has a concentration of majority charge carriers that is greater than the concentration of majority charge carriers in the first, second, third, and fourth drain regions, wherein the fourth drain region is a fourth drain extension region.

7. An integrated circuit comprising a high voltage transistor on a semiconductor, the high voltage transistor comprising:

a source formed in the semiconductor;

a drain formed in the semiconductor;

a channel between the source and the drain, wherein the drain comprises a first drain extension region, a second drain extension region, and a third drain region, a concentration of majority charge carriers in the drain increasing farther away from the channel at junctions between the three drain regions;

a first doped well;

the first drain extension region comprising a region where part of the first doped well overlaps part of a first doped region;

a second doped well; and the second drain extension region comprising a region where part of the second doped well overlaps part of the first doped region.

8. The integrated circuit of claim 7 further comprising:

a third doped well;

the third drain region comprising a third extension region formed where part of the third doped well overlaps part of the first doped region; and a fourth drain region that comprises a low resistance drain contact region.

9. The integrated circuit of claim 7 further comprising:

a third doped well;

the third drain region comprising a third extension region formed where part of the third doped well overlaps part of the first doped region;

a fourth drain extension region; and a fifth drain region that comprises a drain contact region.

10. The integrated circuit of claim 9 further comprising:

a fourth doped well;

the fourth drain extension region formed where a portion of the fourth doped well overlaps part of the first doped region.

11. The integrated circuit of claim 8 wherein,

P-type dopant is diffused into the first doped well,

P-type dopant is diffused into the second doped well,

N-type dopant is diffused into the third doped well, and

N-type dopant is diffused the first doped region.

12. A high voltage transistor formed on a semiconductor, the transistor comprising:

a gate formed on the semiconductor;

a source formed in the semiconductor; and a drain formed in the semiconductor, wherein the drain comprises a first drain extension where the drain overlaps a first doped well, and a second drain extension where the drain overlaps a second doped well, and dopants that form the first and the second doped wells reduce majority carriers in the drain, and wherein a gradient of majority carriers laterally increases farther away from the gate across the first drain extension, the second drain extension, and a third drain region.

13. A high voltage transistor formed on a semiconductor, the transistor comprising:

a gate formed on the semiconductor;

a source formed in the semiconductor; and a drain formed in the semiconductor, wherein the drain comprises at least four doped drain regions, the four doped drain regions having a gradient of majority charge carriers that laterally increases farther away from the gate across three junctions between the four drain regions, wherein a first drain extension region comprises a portion of a first well that overlaps a first doped region, a second drain extension region comprises a portion of a second well that overlaps the first doped region, a third drain extension region comprises a portion of the first doped region; and a fourth drain region comprises a drain contact region.

14. The high voltage transistor of claim 13 wherein the third drain region comprises a portion of a third well that overlaps the first doped region.

15. The high voltage transistor of claim 13 wherein,

P-type dopant is diffused into the first well,

P-type dopant is diffused into the second well, and

N-type dopant is diffused the first doped region.

16. The high voltage transistor of claim 12 a high voltage transistor formed on a semiconductor, the transistor comprising:

a gate formed on the semiconductor;

a source formed in the semiconductor; and a drain formed in the semiconductor, wherein the drain comprises at least four doped drain regions, the four doped drain regions having a gradient of majority charge carriers that laterally increases farther away from the gate across three junctions between the four drain regions, wherein the drain further comprises:

a first drain extension comprising a portion of a first well that overlaps a first doped region, a second drain extension comprising a portion of a second well that overlaps the first doped region, a third drain extension comprising a portion of a third well that overlaps the first doped region;

a fourth drain extension region; and a fifth drain region that comprises a drain contact region.

17. An integrated circuit comprising at least one high voltage transistor formed on a semiconductor, said transistor comprising:

a source formed in the semiconductor; and a drain formed in the semiconductor, wherein the drain comprises a first portion of a first doped region that overlaps a first doped well, a second portion of the first doped region that overlaps a second doped well, and a drain contact region, and wherein dopants that form the first doped well reduce majority carriers in the first portion of the first doped region, and dopants that form the second doped well reduce majority carriers in the second portion of the first doped region.

18. An integrated circuit comprising at least one high voltage transistor formed on a semiconductor, said transistor comprising:

a source formed in the semiconductor; and a drain formed in the semiconductor, wherein the drain comprises a first portion of a first doped region that overlaps a first doped well, a second portion of the first doped region that overlaps a second doped well, and a drain contact region, wherein the drain further comprises a third portion of the first doped region that overlaps a third doped well, wherein the third portion of the first doped region has a concentration of majority carriers that is greater than the concentration of majority carriers in the first and the second portions of the first doped region.

19. The integrated circuit of claim 18 wherein the drain further comprises a fourth portion of the first doped region that overlaps a fourth doped well, wherein the fourth portion of the first doped region has a concentration of majority carriers that is greater than the concentration of majority carriers in the third portion of the first doped region.

20. The integrated circuit of claim 17 wherein the transistor is an NMOS transistor, the first doped region of the drain is doped with N-type dopant, the first doped well is doped with P-type dopant, and the second doped well is doped with P-type dopant.

21. An integrated circuit comprising at least one high voltage transistor formed on a semiconductor, said transistor comprising:
   a source formed in the semiconductor; and
   a drain formed in the semiconductor, wherein the drain comprises a first portion of a first doped region that overlaps a first doped well, a second portion of the first doped region that overlaps a second doped well, and a drain contact region,
   wherein the drain further comprises:
      a third portion of the first doped region that overlaps a third doped well, and
      wherein the concentration of majority charge increases across junctions between the three portions of the first doped region moving laterally away from a gate of the transistor.

22. The integrated circuit of claim 21 wherein the drain further comprises:
   a fourth portion of the first doped region, and
   wherein the concentration of majority charge increases across functions between the four portions of the first doped region moving laterally away from a gate of the transistor.

23. The integrated circuit of claim 17 wherein the transistor is an NMOS or a PMOS device.

24. An integrated circuit comprising at least one high voltage transistor formed on a semiconductor, said transistor comprising:
   a source formed in the semiconductor; and
   a drain formed in the semiconductor, wherein the drain comprises a first portion of a first doped region that overlaps a first doped well, a second portion of the first doped region that overlaps a second doped well, and a drain contact region,
   wherein a concentration of majority charge carriers increases laterally away from a channel of the transistor across junctions between each doped region of the drain.

25. A high voltage transistor formed on a semiconductor, the transistor comprising:
   a gate formed on the semiconductor;
   a source formed in the semiconductor; and
   a drain formed in the semiconductor, wherein the drain region has a graded concentration of first majority charge carriers that increases across junctions between a first drain extension, a second drain extension, and a third drain region moving laterally farther away from the gate, and
   wherein a concentration of second charge carriers in a region beneath the drain decreases moving laterally farther away from the gate to underneath the third drain region, the second charge carriers being of the opposite doping type as the first majority charge carriers.

26. The high voltage transistor of claim 25 further comprising:
   a first doped well;
   the first drain extension comprising a region where part of the first doped well overlaps part of a first doped region;
   a second doped well; and
   the second drain extension comprising a region where part of the second doped well overlaps part of the first doped region.

27. The high voltage transistor of claim 26 further comprising:
   a third doped well;
   the third drain region comprising a third drain extension region formed where part of the third doped well overlaps part of the first doped region;
   a fourth drain extension region; and
   a fifth drain region that comprises a drain contact region.

28. The high voltage transistor of claim 25 wherein the third drain region comprises a low resistance drain contact region.

29. The high voltage transistor of claim 26 further comprising:
   a third doped well;
   the third drain region comprising a third drain extension formed where part of the third doped well overlaps part of the first doped region; and
   a fourth drain contact region.

* * * * *